(12) United States Patent
Katayama et al.

(10) Patent No.: US 9,420,735 B2
(45) Date of Patent: Aug. 16, 2016

(54) STRUCTURE AND STRUCTURE MANUFACTURING METHOD

(75) Inventors: Tomofumi Katayama, Osaka (JP); Nozomu Hikino, Osaka (JP); Shuhhei Ohguchi, Osaka (JP); Takashi Naito, Osaka (JP); Hiroyuki Takebe, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 267 days.

(21) Appl. No.: 14/119,159

(22) PCT Filed: Aug. 9, 2012

(86) PCT No.: PCT/JP2012/070400
§ 371 (c)(1),
(2), (4) Date: Nov. 20, 2013

(87) PCT Pub. No.: WO2013/024793
PCT Pub. Date: Feb. 21, 2013

(65) Prior Publication Data
US 2014/0185265 A1    Jul. 3, 2014

(30) Foreign Application Priority Data

Aug. 12, 2011  (JP) .................. 2011-177317
Oct. 27, 2011  (JP) .................. 2011-236527

(51) Int. Cl.
*H05K 7/00* (2006.01)
*H05K 5/00* (2006.01)
*H05K 9/00* (2006.01)
*H04M 1/02* (2006.01)
*H01Q 1/24* (2006.01)
*H01Q 1/38* (2006.01)
*H05K 5/02* (2006.01)

(52) U.S. Cl.
CPC ............ *H05K 9/0064* (2013.01); *H01Q 1/242* (2013.01); *H01Q 1/38* (2013.01); *H04M 1/0202* (2013.01); *H05K 5/0247* (2013.01); *H04M 1/026* (2013.01); *Y10T 29/49117* (2015.01)

(58) Field of Classification Search
CPC ..................................... G06F 1/1616
USPC ........................ 361/679.01–679.03
See application file for complete search history.

(56) References Cited

U.S. PATENT DOCUMENTS

2007/0241971 A1*  10/2007  Tsujimura ............. G06F 1/1616
                                            343/702
2009/0058737 A1   3/2009  Tsujimura et al.
2012/0034884 A1   2/2012  Sekine

FOREIGN PATENT DOCUMENTS

EP    2312688 A2   4/2011
JP    5-145230 A    6/1993

(Continued)

*Primary Examiner* — Jerry Wu
(74) *Attorney, Agent, or Firm* — Birch, Stewart, Kolasch & Birch, LLP

(57) ABSTRACT

A structure includes a housing made of a dielectric substance, an electrically conductive member embedded in the housing so as to penetrate the housing, and an electrically conductive pattern which is provided on at least one of surfaces, in which the electrically conductive member lies by penetrating the housing, so that the electrically conductive pattern is electrically connected with the electrically conductive member. The electrically conductive pattern is made up of an electrically conductive film which has no self-shape retention property.

12 Claims, 22 Drawing Sheets

(56) References Cited

FOREIGN PATENT DOCUMENTS

| JP | 2007-288360 A | 11/2007 |
| JP | 2007-305741 A | 11/2007 |
| JP | 2008-140902 A | 6/2008 |
| JP | 2009-65388 A | 3/2009 |
| JP | 2010-263283 A | 11/2010 |
| JP | 2011-61251 A | 3/2011 |

* cited by examiner

STRUCTURE AND STRUCTURE MANUFACTURING METHOD

TECHNICAL FIELD

The present invention relates to a structure including an electrically conductive member which is provided so as to penetrate a housing.

BACKGROUND ART

Patent Literature 1 discloses a mobile phone including (i) an insert metal plate, (ii) a pin fixed to the insert metal plate, and (iii) a resin part formed by insert molding so that (a) a peripheral edge of the insert metal plate is covered with the resin part and (b) an end surface of the pin is exposed.

According to the mobile phone of Patent Literature 1, a component container section for containing a circuit substrate and electronic components is configured to have (i) a bottom surface which is made up of the insert metal plate having an antenna function for digital television, (ii) a lateral surface which is made up of the resin part that is molded integral with the insert metal plate, and (iii) an upper surface made up of a pressing member that presses a whole circumference of a packing member. With the configuration, it is possible to achieve airtightness.

Moreover, the end surface of the metal pin fixed to the insert metal plate having the antenna function for digital television is in contact with a flexible antenna spring leaf which is fastened together with a hinge mounting metal piece that is connected with the circuit substrate such that the flexible antenna spring leaf is being pressed toward the end surface of the metal pin. This makes it possible to electrically connect the insert metal plate, which has the antenna function for digital television, with the circuit substrate for sure.

CITATION LIST

Patent Literature

[Patent Literature 1]
Japanese Patent Application Publication Tokukai No. 2010-263283 A (Nov. 18, 2010)

SUMMARY OF INVENTION

Technical Problem

The inventors of the present invention diligently study, as a novel and useful structure which can be incorporated in an electronic device, a structure including a housing, an electrically conductive member that penetrates the housing, and an electrically conductive pattern which is provided on a surface of the housing so as to be electrically connected with the electrically conductive member.

According to the configuration disclosed in Patent Literature 1, the insert metal plate and the resin part are integrally molded while the pin is being fixed to the insert metal plate, and therefore a structure, a material, and the like are restricted. For example, the insert metal plate is required to have strength enough to hold the pin. Moreover, since the insert metal plate constitutes the bottom surface of the component container section, a structure, a material, and the like are restricted also in view of this. As above described, the insert metal plate configured as disclosed in Patent Literature 1 is low in degree of freedom in design.

The present invention is accomplished in view of the problem, and its main object is to provide a structure which (i) includes a housing, an electrically conductive member that penetrates the housing, and an electrically conductive pattern which is provided on a surface of the housing so as to be in contact with the electrically conductive member and (ii) is high in degree of freedom in design.

Solution to Problem

In order to attain the object, the structure of the present invention includes: a housing which is made of a dielectric substance; an electrically conductive member which is embedded in the housing so as to penetrate the housing; and an electrically conductive pattern which is provided on at least one of surfaces in which the electrically conductive member lies by penetrating the housing, the electrically conductive pattern being electrically connected with the electrically conductive member, the electrically conductive pattern being made up of an electrically conductive film which has no self-shape retention property.

According to the configuration, regions between which the housing is located can be suitably electrically connected with each other. The electrically conductive pattern can be used as an antenna or can be used to be electrically connected with a member which is provided in an area in which the electrically conductive pattern is provided. Here, according to the configuration, the electrically conductive pattern is made up of the electrically conductive film which has no self-shape retention property. This allows the electrically conductive pattern to be fixed in an arbitrary shape, and it is therefore possible to improve a degree of freedom in design.

The method of present invention for manufacturing a structure is a method for manufacturing a structure including (i) a housing which is made of a dielectric substance, (ii) an electrically conductive member, and (iii) an electrically conductive pattern which is made up of an electrically conductive film that has no self-shape retention property, the method including the steps of: (a) forming a part of the structure which includes the housing and the electrically conductive member, the electrically conductive member being embedded in the housing so as to penetrate the housing; and (b) providing, after the step (a), the electrically conductive pattern on at least one of surfaces, in which the electrically conductive member lies by penetrating the housing, so that the electrically conductive pattern is electrically connected with the electrically conductive member.

According to the configuration, the electrically conductive pattern is provided after the electrically conductive member is fixed to the housing. From this, even in a case where the electrically conductive pattern is made up of an electrically conductive film that has no self-shape retention property, the electrically conductive pattern can be provided on the housing and on the electrically conductive member without any problem. This is because, in the step (a), the electrically conductive member is embedded in the housing and therefore the electrically conductive pattern does not need to have been fixed to the electrically conductive member in advance, unlike the technique disclosed in Patent Literature 1. Moreover, the electrically conductive pattern itself is configured by the electrically conductive film which has no self-shape retention property, and it is therefore possible to fix the electrically conductive pattern in an arbitrary shape. This allows an improvement in degree of freedom in design.

Advantageous Effects of Invention

The structure of the present invention includes: a housing which is made of a dielectric substance; an electrically conductive member which is embedded in the housing so as to penetrate the housing; and an electrically conductive pattern which is provided on at least one of surfaces in which the electrically conductive member lies by penetrating the housing, the electrically conductive pattern being electrically connected with the electrically conductive member, the electrically conductive pattern being made up of an electrically conductive film which has no self-shape retention property. This makes it possible to improve a degree of freedom in design.

DESCRIPTION OF EMBODIMENTS

Embodiment 1

Structure

Figure 1:
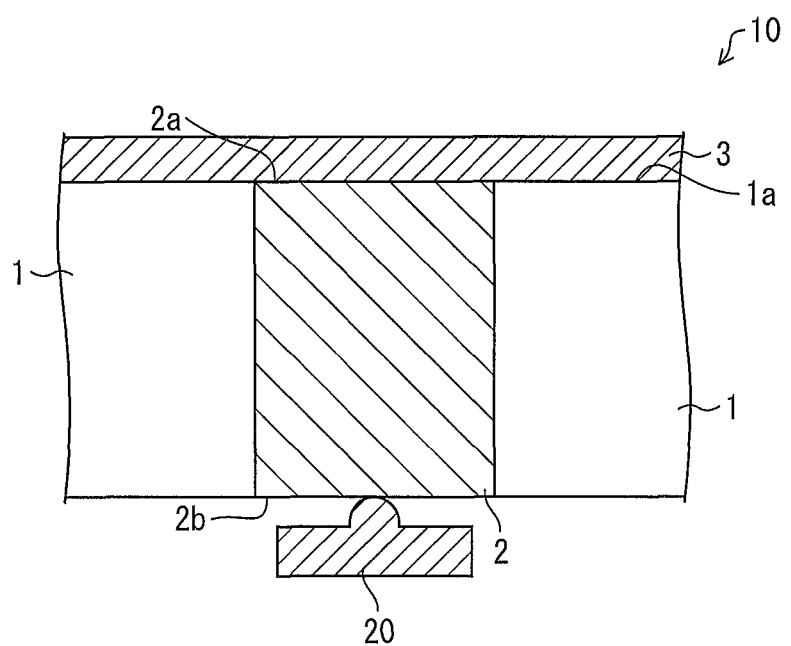
FIG. 1 is a cross-sectional view schematically illustrating a configuration of a structure in accordance with an embodiment (Embodiment 1) of the present invention.

FIG. 1 is a cross-sectional view schematically illustrating a configuration of a structure in accordance with an embodiment (Embodiment 1) of the present invention. A structure 10 of the present embodiment includes a housing 1, an electrically conductive member 2, and an electrically conductive pattern 3 (see FIG. 1).

The housing 1 is made of a dielectric substance and constitutes a housing of an electronic device. The housing of the electronic device is a member for containing electronic components provided in the electronic device. The electrically conductive member 2 is an electric conductor which is embedded in the housing 1 so as to penetrate the housing 1. The electrically conductive member 2 is provided so as to electrically connect regions (e.g., in FIG. 1, (i) an upper part of the housing 1 (hereinafter, referred to also as "outside of the housing 1") and (ii) a lower part of the housing 1 (hereinafter, referred to also as "inside of the housing 1")) between which the housing 1 is located. Although not limited to this, the housing 1 can be made of, for example, resin. Although not limited to this, the electrically conductive member 2 can be made of, for example, metal.

The electrically conductive member 2 is fixed to the housing 1, and a method for fixing the electrically conductive member 2 to the housing 1 is not limited. For example, it is preferable that the electrically conductive member 2 and the housing 1 are integrally molded.

The electrically conductive pattern 3 is an electrically conductive film which is provided on one surface (which is made up of a surface 1a and a surface 2a), in which the electrically conductive member 2 lies by penetrating the housing 1 in the structure 10, so as to be electrically connected with the electrically conductive member 2. The electrically conductive pattern 3 is an electrically conductive film that does not have a self-shape retention property, i.e., that cannot retain its shape by itself. Examples of the electrically conductive pattern 3 encompass (i) an electrically conductive film such as a flexible printed circuit board that has flexibility and (ii) an electrically conductive film which is formed by applying an electrically conductive paste.

According to the structure 10 of Embodiment 1, the regions between which the housing 1 is located can be suitably electrically connected with each other. The electrically conductive pattern 3 can be used as an antenna or can be used to be electrically connected with a member which is provided in an area in which the electrically conductive pattern 3 is provided. Here, according to the structure 10, the electrically conductive pattern 3 is made up of an electrically conductive film which has no self-shape retention property. This allows the electrically conductive pattern 3 to be fixed in an arbitrary shape, and it is therefore possible to improve a degree of freedom in design.

The electrically conductive paste is an electrically conductive material having a viscosity. The electrically conductive paste is made up of at least metal powder and a solvent, preferably made up of metal powder, binder resin, and a solvent. In the electrically conductive film formed by applying the electrically conductive paste, for example, a solvent can be removed by drying or can partially remain. As a method for applying the electrically conductive paste, various kinds of methods can be employed. It is preferable that the electrically conductive paste is applied by printing (e.g., flexographic printing, offset printing, silk-screen printing, or pad printing), in which a flexible printing plate is used, so that the electrically conductive pattern 3 conforms to shapes of the housing 1 and the electrically conductive member 2.

In a case where the electrically conductive pattern 3 is formed by applying the electrically conductive paste, it is possible to make the electrically conductive pattern thin. Moreover, it is possible to easily form the electrically conductive pattern into a curved surface shape. This allows a further improvement in degree of freedom in design.

In a case where the electrically conductive paste is applied by the printing (such as flexographic printing, offset printing, silk-screen printing, or pad printing), in which the flexible printing plate is used, it is possible to successfully print the electrically conductive pattern in accordance with the shapes of the housing and the like. This makes it possible also to contribute to, for example, mass production of the structure.

Note that, even in a case where the electrically conductive pattern 3 is configured by a flexible electrically conductive film such as a flexible printed circuit board, the electrically conductive pattern 3 can be fixed in an arbitrary shape. It is therefore possible to improve a degree of freedom in design.

The electrically conductive member 2 has a surface 2b which is opposite to the surface 1a on which the electrically conductive pattern 3 is provided. The surface 2b is electrically connected with a terminal (e.g., a spring terminal 20) which is provided inside the housing 1. With the configuration, the electrically conductive pattern 3 is electrically connected with other constituent members via the electrically conductive member 2 and the spring terminal 20.

Figure 2:
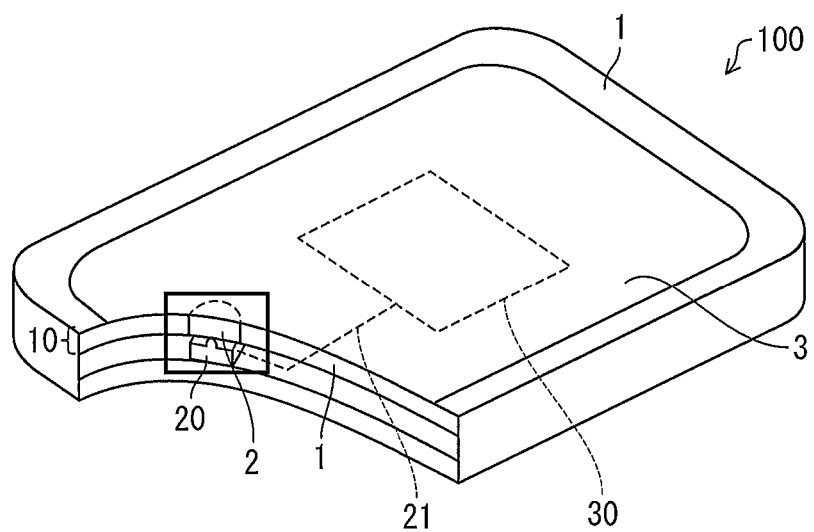
FIG. 2 is a cross-sectional view schematically illustrating a configuration of a communication apparatus including a structure in accordance with an embodiment (Embodiment 1) of the present invention.

The structure 10 thus configured can be, for example, incorporated in a communication apparatus. FIG. 2 is a cross-sectional view schematically illustrating a configuration of a communication apparatus 100 including the structure 10. In FIG. 2, a part surrounded by a rectangle corresponds to the structure 10. The communication apparatus 100 can be, for example, a tablet communication apparatus (e.g., a smart phone, an electric book terminal, or a tablet PC). Note, however, that the communication apparatus 100 is not limited to these, provided that the communication apparatus 100 includes a housing and has at least one of (i) a function to receive information from another apparatus and (ii) a function to transmit information to another apparatus.

The housing 1 serves as a housing of the communication apparatus 100 (see FIG. 2). The electrically conductive pattern 3 is formed on one surface of the housing 1. Note that, it is sufficient that a part of the housing 1, which part is in contact with the electrically conductive member 2 and the electrically conductive pattern 3, is made of a dielectric substance. Therefore, it is not necessary to configure the entire housing 1 by the dielectric substance (in other words, a part of the housing 1, which part is made of a material other than the dielectric substance, is excluded from the structure 10).

The spring terminal 20 is connected via an electric supply line 21 with a communication circuit 30 included in the communication apparatus 100. In the communication apparatus 100, electric power is supplied from the communication circuit 30 to the electrically conductive pattern 3 via the electric supply line 21, the spring terminal 20, and the electrically conductive member 2 so that the electrically conductive pattern 3 operates as an antenna. In this case, the surface 2b of the electrically conductive member 2 is configured to be connected with the communication circuit 30. In other words, the surface 2b serves as an electrode to be connected with the electric supply line 21 via which electric power is supplied to the electrically conductive pattern 3.

Note that the housing 1 and the electrically conductive pattern 3 do not necessarily need to be exposed in a surface of the communication apparatus 100, and can be contained inside the communication apparatus 100. The electrically conductive pattern 3 does not necessarily need to function as an antenna, and can function as an electrically conductive member via which a constituent member, which is connected with the spring terminal 20, is electrically connected with a member which is provided outside the housing 1.

The electrically conductive member 2 can have, for example, a columnar shape, preferably a pin shape. This makes it possible to suitably configure the electrically conductive member 2 that penetrates the housing 1. Note that the shape of the electrically conductive member 2 is not limited to a round columnar shape and can be a prismatic shape. Moreover, a thickness of the electrically conductive member 2 does not need to be a uniform thickness.

Figure 3:
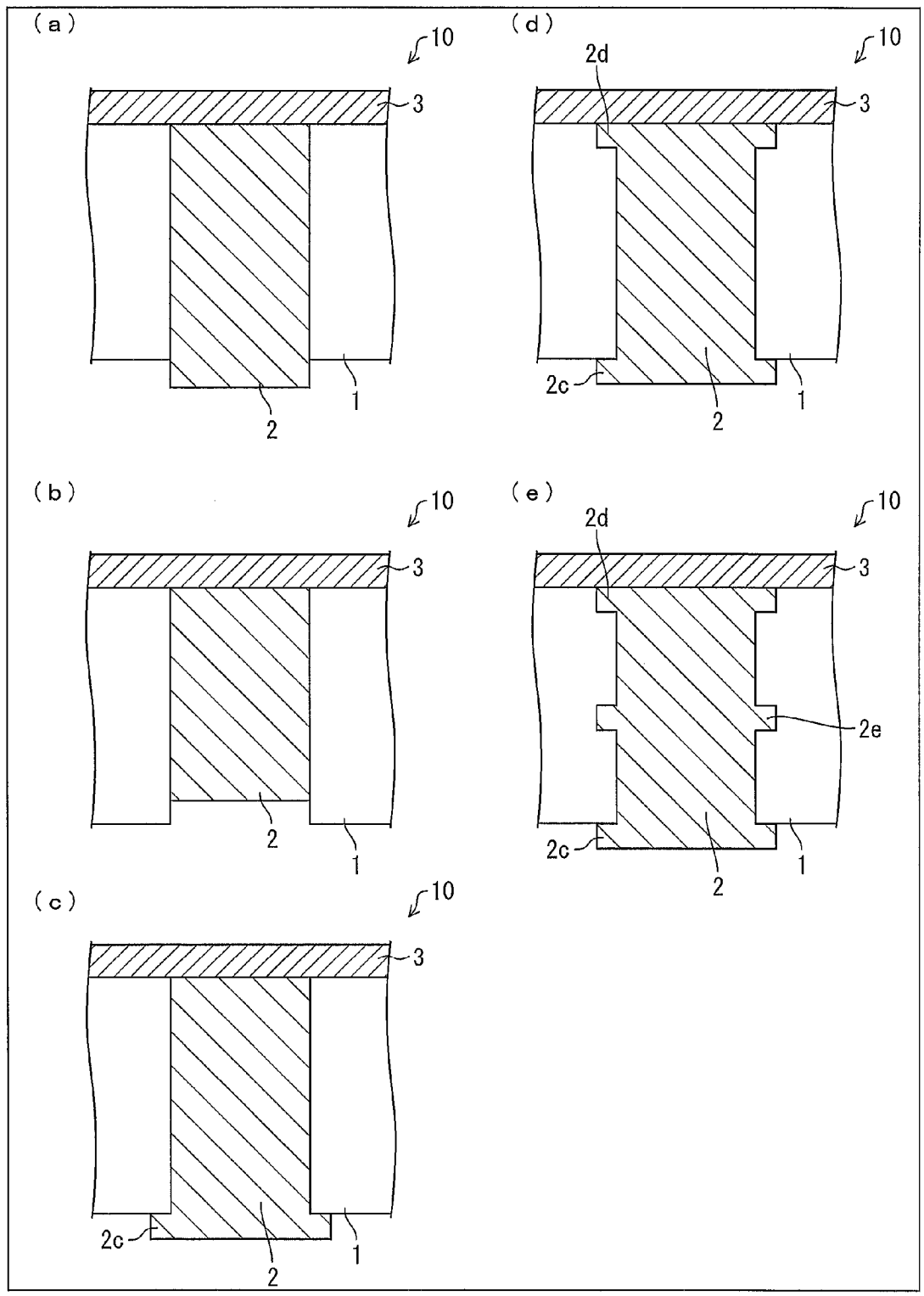
FIG. 3 is a view illustrating a variation in shape of an electrically conductive member in a structure in accordance with an embodiment (Embodiment 1) of the present invention.

FIG. 3 illustrates variations of pin shape that the electrically conductive member 2 can employ. The electrically conductive member 2 can protrude from the housing 1 (see (a) of FIG. 3). The electrically conductive member 2 can be located only in a hollow in the housing 1 (see (b) of FIG. 3). A flange 2c can be provided on a side of the electrically conductive member 2 which side is opposite to a side on which the electrically conductive pattern 3 is provided (see (c) of FIG. 3). In addition to the flange 2c, a flange 2d can be provided on the side of the electrically conductive member 2 on which side the electrically conductive pattern 3 is provided (see (d) of FIG. 3). In addition to the flanges 2c and 2d, a flange 2e can be provided in a middle of the electrically conductive member 2 (see (e) of FIG. 3). In the other embodiments described later, further variations of the shape of the electrically conductive member 2 will be described.

Figure 5:
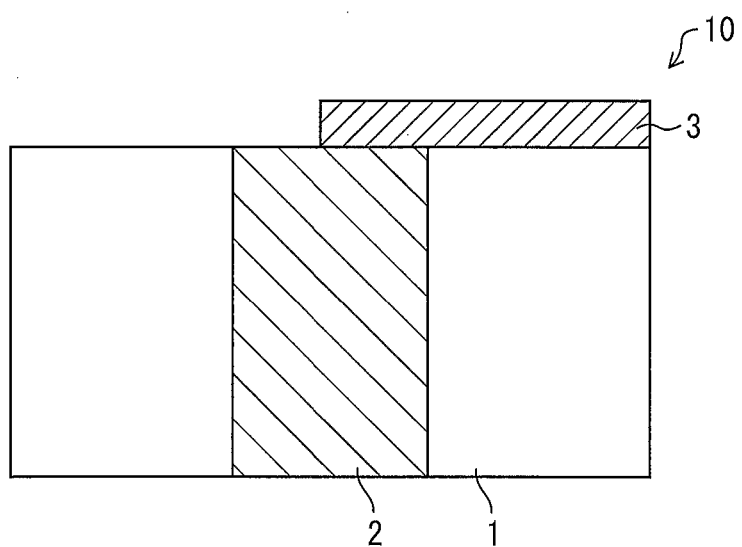
FIG. 5 is a cross-sectional view illustrating a modification example of a structure in accordance with an embodiment (Embodiment 1) of the present invention.

The electrically conductive pattern 3 is not limited to a particular shape, and can have a shape which is set as appropriate in accordance with a design of the structure 10 and the communication apparatus 100, and the like. For example, the electrically conductive pattern 3 can have a shape that partially covers the surface 2a of the electrically conductive member 2 as illustrated in FIG. 5.

Figure 6:
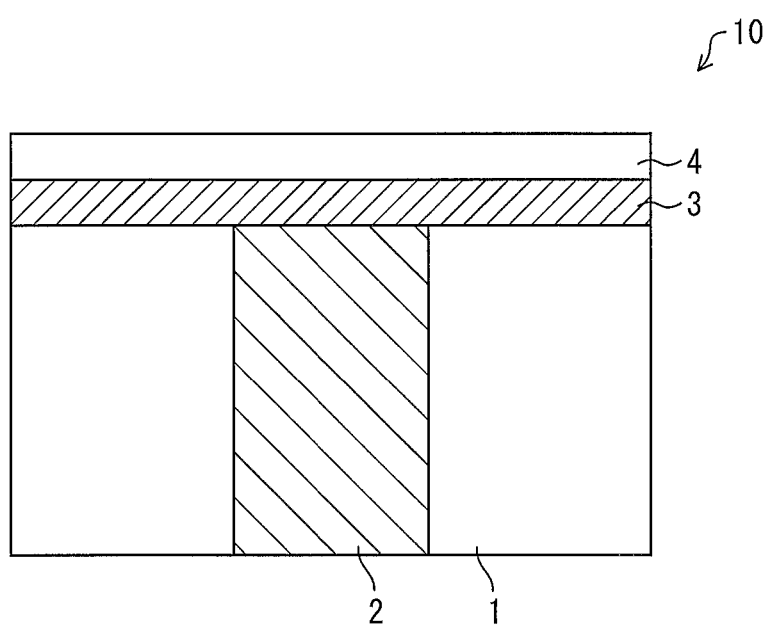
FIG. 6 is a cross-sectional view illustrating a modification example of a structure in accordance with an embodiment (Embodiment 1) of the present invention.

Alternatively, in an embodiment, a protective layer 4 can be further provided on the electrically conductive pattern 3 as illustrated in FIG. 6. In a case where the protective layer 4 is provided on the electrically conductive pattern 3, it is possible to prevent the electrically conductive pattern 3 from (i) being damaged and (ii) being seen. Note that the protective layer 4 is not limited to a particular one, provided that the protective layer 4 (i) is made of a material that does not influence a property of the antenna and (ii) has a strength enough to protect the electrically conductive pattern 3. Here, the material that does not influence a property of the antenna indicates a material that does not significantly deteriorate the property of the antenna when the protective layer 4 made of the material is provided. The protective layer 4 can be provided on the electrically conductive pattern 3 by a method such as attaching, applying, or spraying. For example, the protective layer 4 can suitably be formed by a coating agent (e.g., a resin solution). The applied coating agent can serve also as paint on the housing 1. Alternatively, the protective layer 4 can be a sheet that (i) is attached to the electrically conductive pattern 3 like a sticker or (ii) is bonded to the electrically conductive pattern 3, by heat and/or pressure.

(Method for Manufacturing Structure)

A method for manufacturing the structure 10 includes, for example, (i) a first step of forming a part (i.e., the housing 1 and the electrically conductive member 2 which is embedded so as to penetrate the housing 1) of the structure 10 and (ii) a second step of providing the electrically conductive pattern 3 on at least one of surfaces of the housing 1, in which surfaces the electrically conductive member 2 lies by penetrating the housing 1, so as to be electrically connected with the electrically conductive member 2.

According to the method for manufacturing the structure in accordance with Embodiment 1, the electrically conductive pattern 3 is provided after the electrically conductive member 2 is fixed to the housing 1. With the arrangement, even in a case where the electrically conductive pattern 3 is made up of an electrically conductive film (e.g., an electrically conductive paste or a flexible printed circuit board) that has no self-shape retention property, the electrically conductive pattern 3 can be provided on the housing 1 and the electrically conductive member 2 (i.e., on the surface 1a and the surface 2a) without any problem. This is because, in the first step, the electrically conductive member 2 is embedded in the housing 1 and therefore the electrically conductive pattern 3 does not need to be fixed to the electrically conductive member 2, unlike the technique disclosed in Patent Literature 1.

In the first step, for example, the electrically conductive member 2 and the housing 1 can be integrally molded. In such a case, the electrically conductive member 2 and the housing 1 can be integrally molded by insert molding in which (i) an electrically conductive member 2 formed in advance is fixed to a die for forming the housing 1, then (ii) the die is closed, and then (iii) a dielectric material for forming the housing 1 is supplied and hardened in the die. In particular, in a case where the electrically conductive member 2 has the flanges 2c through 2e, it is preferable to integrally mold the electrically conductive member 2 and the housing 1.

Alternatively, it is possible that the electrically conductive member 2 and the housing 1 are separately formed and then the electrically conductive member 2 is embedded in the housing 1 by inserting the electrically conductive member 2 into the housing 1. Note that the flange 2c or 2d can be provided to the electrically conductive member 2 by a method such as thermal caulking after the electrically conductive member 2 is embedded in the housing 1.

In the second step, for example, the electrically conductive pattern 3 can be formed by applying an electrically conductive paste to the surface 1a and the surface 2a in an intended pattern and then drying the applied electrically conductive paste. As a method for applying the electrically conductive paste, various kinds of methods can be employed. It is preferable that the electrically conductive paste is applied by printing (e.g., flexographic printing, offset printing, silk-screen printing, or pad printing), in which a flexible printing plate is used, so that the electrically conductive pattern 3 conforms to shapes of the housing 1 and the electrically conductive member 2.

Figure 4:
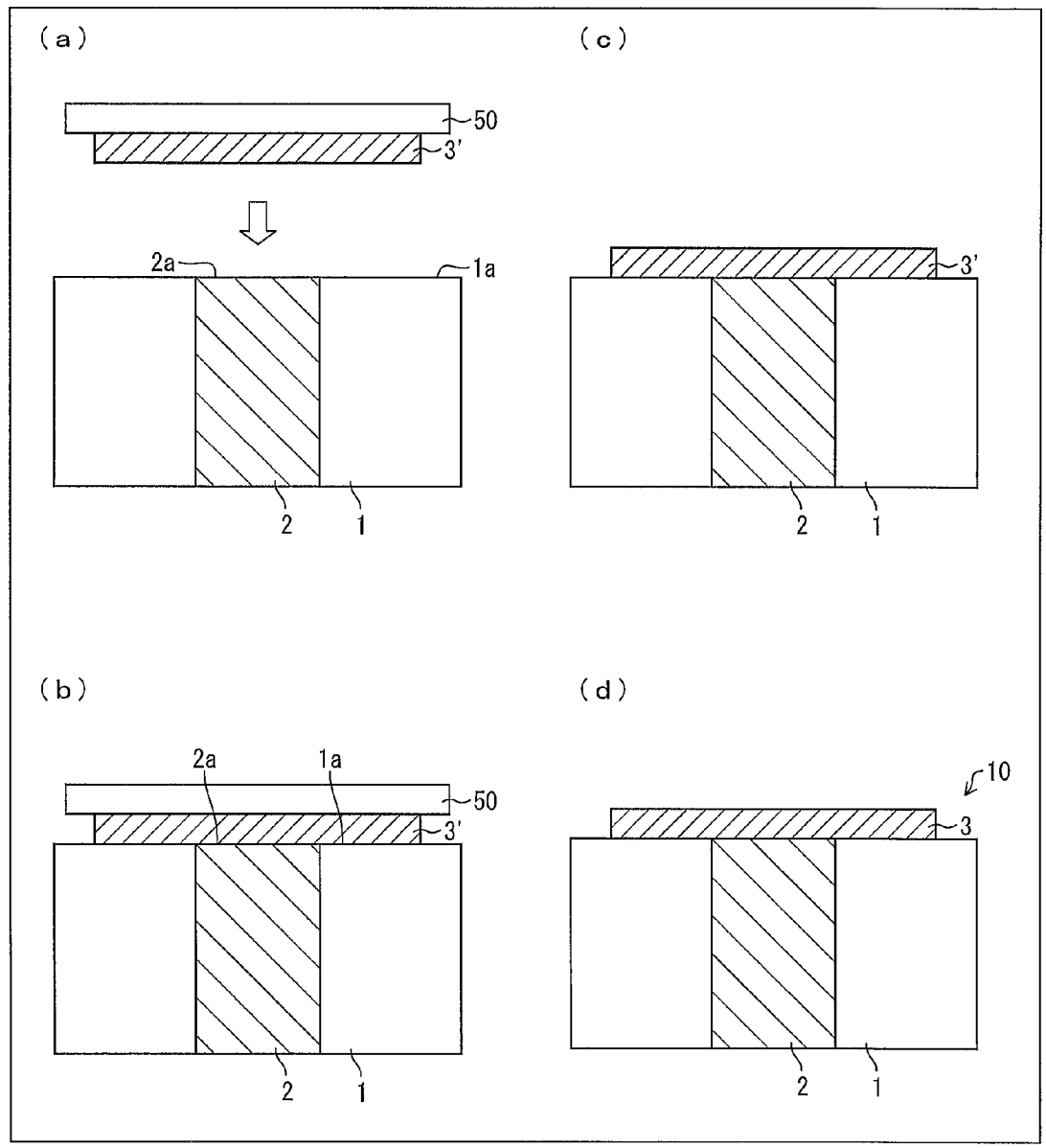
FIG. 4 is a view for explaining an example of a second step in a method for manufacturing a structure in accordance with an embodiment (Embodiment 1) of the present invention.

FIG. 4 is a view for explaining an example of the second step. First, a printing plate 50, on which an intended pattern is formed by an electrically conductive paste 3' in advance, is moved closer to same-side surfaces (i.e., the surface 1a and the surface 2a) of the housing 1 and the electrically conductive member 2 which have been formed in the first step (see (a) of FIG. 4). Then, the printing plate 50 is pressed toward the surface 1a and the surface 2a as illustrated in (b) of FIG. 4 so that the pattern of the electrically conductive paste 3' is transferred onto the surface 1a and the surface 2a ((c) of FIG. 4). Then, by drying the pattern of the electrically conductive paste 3', the electrically conductive pattern 3 can be formed as illustrated in (d) of FIG. 4. Alternatively, it is possible to employ a silk-screen printing method in which the electrically conductive paste 3' is pressed out via holes provided in the printing plate 50.

In a case where the electrically conductive pattern 3 is configured by the flexible printed circuit board, the electrically conductive pattern 3 can be configured by attaching the flexible printed circuit board to the surface 1a and the surface 2a in the second step so that the flexible printed circuit board is electrically connected to the electrically conductive member 2.

Note that, in a case of forming the structure 10 which includes the protective layer 4 as illustrated in FIG. 6, the protective layer 4 can be easily formed by applying a coating agent (e.g., a resin solution) to the electrically conductive pattern 3 and then drying the coating agent, after the second step.

Embodiment 2

In Embodiment 1, a small curved surface (R) is often formed, for reasons of manufacturing, at an outer edge of the surface 2a of the electrically conductive member 2, which surface 2a is located on the side on which the electrically conductive pattern 3 is provided. That is, a round part 2f can be formed by rounding off a corner, i.e., a boundary between (i) a surface X (first surface) of the electrically conductive member 2, which surface X is in contact with the housing 1, and (ii) a surface Y (second surface) of the electrically conductive member 2, which surface Y is adjacent to the surface X and on which surface Y the electrically conductive pattern 3 is provided (see FIG. 7).

Figure 7:
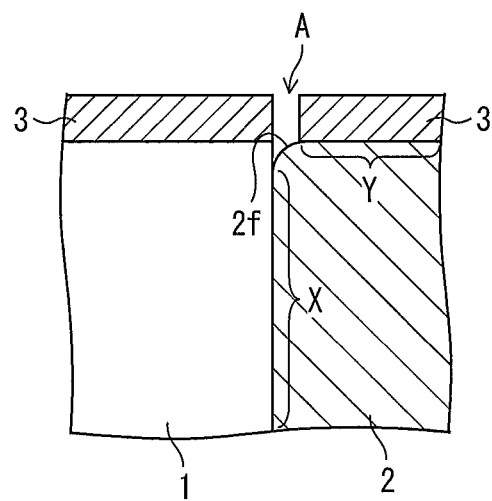
FIG. 7 is a view illustrating a state in which an electrically conductive pattern is broken off by a small curved surface at an outer edge of a surface of an electrically conductive member which surface is located on an electrically conductive pattern side.

In a case where the housing 1 and the electrically conductive member 2 are arranged so as to have respective surfaces that are flush with each other as illustrated in FIG. 7, the small curved surface or the round part 2f is to be located below the surface of the housing 1 so that a small recess is formed (see A in FIG. 7). In a case where such a small recess is formed, the electrically conductive pattern 3 can be broken off above the recess. For example, in a case where the electrically conductive pattern 3 is formed by an electrically conductive paste, it is possible that the electrically conductive paste does not enter the recess and accordingly the electrically conductive pattern is broken off. Alternatively, in a case where the electrically conductive pattern 3 is configured by a flexible printed circuit board, a strength of the flexible printed circuit board above the recess is decreased, and the flexible printed circuit board is more likely to be broken off by some kind of force. According to Embodiment 2 described below, it is possible to suitably inhibit the electrically conductive pattern 3 from being broken off due to the small curved surface or the round part 2f.

Figure 8:
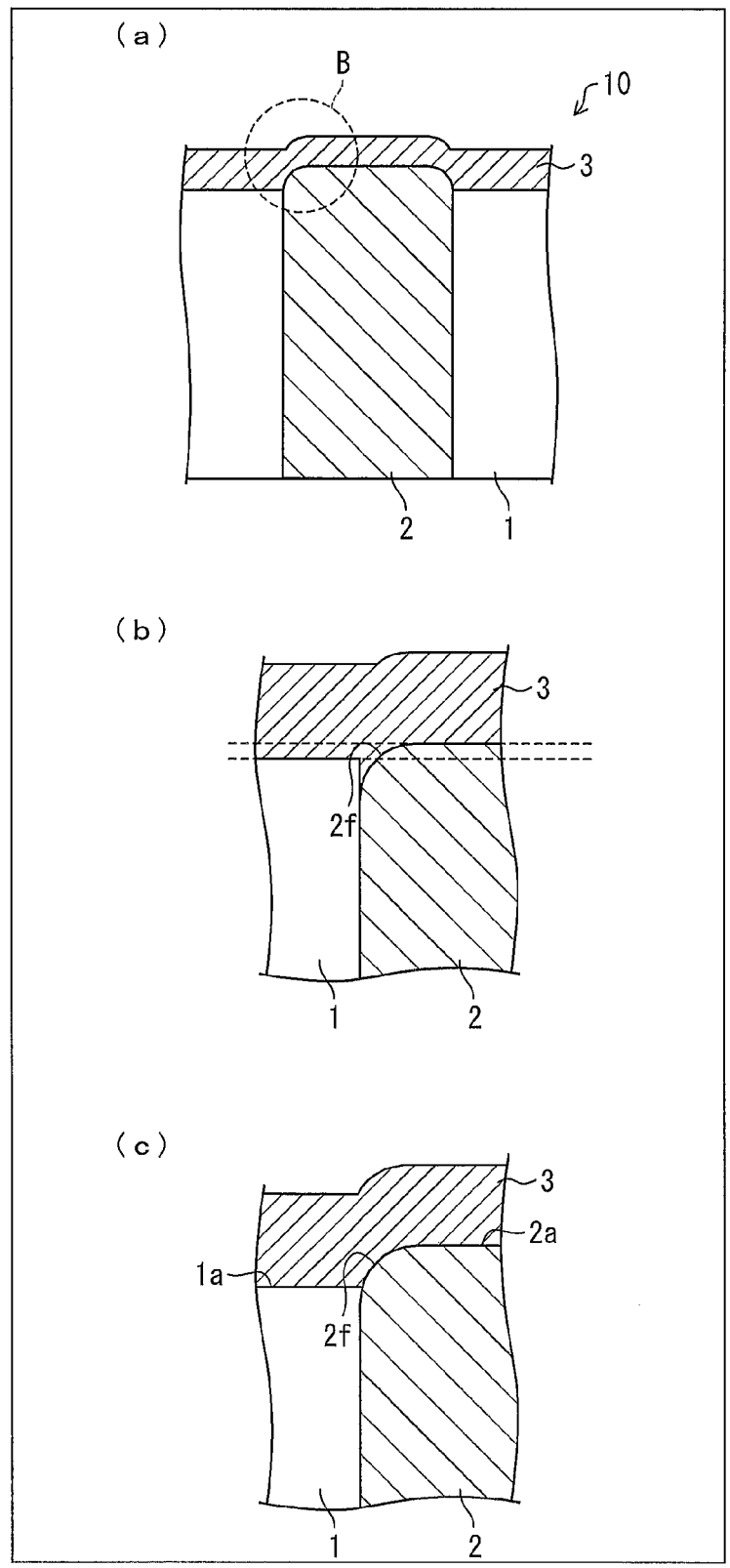
FIG. 8 is a view illustrating a structure in accordance with an embodiment (Embodiment 2) of the present invention.

FIG. 8 is a view illustrating a structure 10 in accordance with an embodiment (Embodiment 2) of the present invention. According to the structure 10 of Embodiment 2, the electrically conductive member 2 protrudes from the housing 1 toward the electrically conductive pattern 3 (see (a) of FIG. 8). More specifically, at least part of the round part 2f of the electrically conductive member 2 protrudes from the housing 1 toward the electrically conductive pattern 3 (see (b) of FIG. 8), and preferably, the entire round part 2f of the electrically conductive member 2 protrudes from the housing 1 toward the electrically conductive pattern 3 (see (c) of FIG. 8). Note that the round part 2f indicates a rounded part formed by rounding off a corner, i.e., the boundary between (i) the first surface of the electrically conductive member 2 which first surface is in contact with the housing 1 and (ii) the second surface of the electrically conductive member 2 which second surface is adjacent to the first surface and on which second surface the electrically conductive pattern 3 is provided. Such a rounded part (small curved surface) is often formed inevitably for reasons of manufacturing.

According to the structure 10 of Embodiment 2, the electrically conductive member 2 protrudes from the housing 1 toward the electrically conductive pattern 3. This allows the small curved surface, which is formed at the outer edge of the electrically conductive member 2 on an electrically conductive pattern 3 side, to be exposed, and it is therefore possible to inhibit a small recess from being formed when the small curved surface is located below the surface of the housing 1. This makes it possible to suitably inhibit the electrically conductive pattern 3 from being broken off.

In an embodiment, at least part of the round part 2f protrudes from the housing 1 toward the electrically conductive pattern 3 (see (b) of FIG. 8). This allows at least part of the round part 2f to be exposed, and it is therefore possible to inhibit a small recess from being formed when the round part 2f is located below the surface of the housing 1. This makes it possible to suitably inhibit the electrically conductive pattern 3 from being broken off.

In an embodiment, the entire round part 2f protrudes from the housing 1 toward the electrically conductive pattern 3. This inhibits the recess from being formed, and it is therefore possible to more suitably inhibit the electrically conductive pattern 3 from being broken off.

Figure 9:
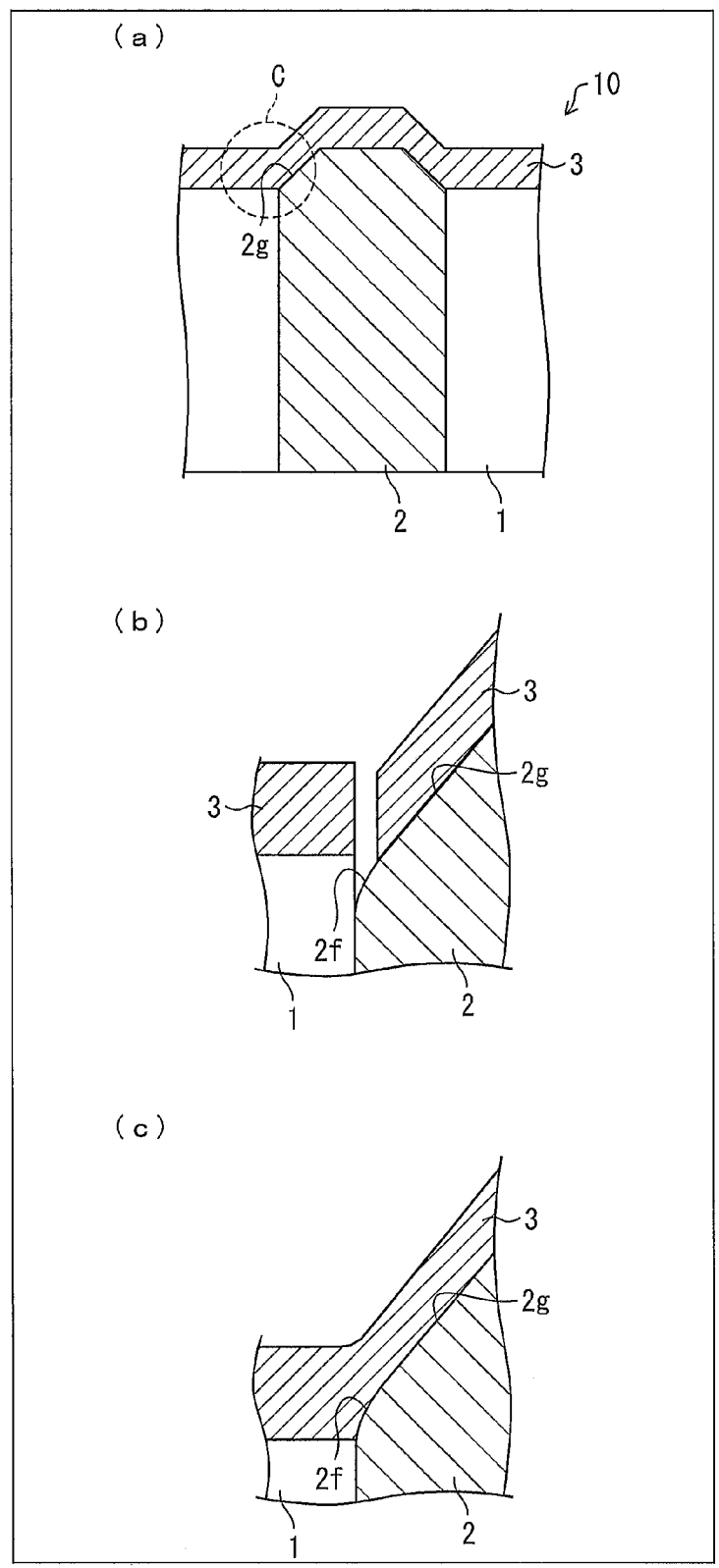
FIG. 9 is a view illustrating a structure in which a surface of an electrically conductive member, which surface is on an electrically conductive pattern side, is a slant (C surface).

FIG. 9 is a view illustrating the structure 10 in which the surface 2a of the electrically conductive member 2, which surface 2a is on the electrically conductive pattern 3 side, is a slant (C surface) 2g. Although the slant 2g can be provided on the surface 2a as illustrated in (a) of FIG. 9, the electrically conductive pattern 3 can be broken off by the round part 2f formed at the outer edge of the surface 2a as illustrated in (b) of FIG. 9. In view of this, it is preferable that the slant 2g is provided on the surface 2a such that the round part 2f protrudes from the housing 1 toward the electrically conductive pattern 3 as illustrated in (c) of FIG. 9.

Figure 10:
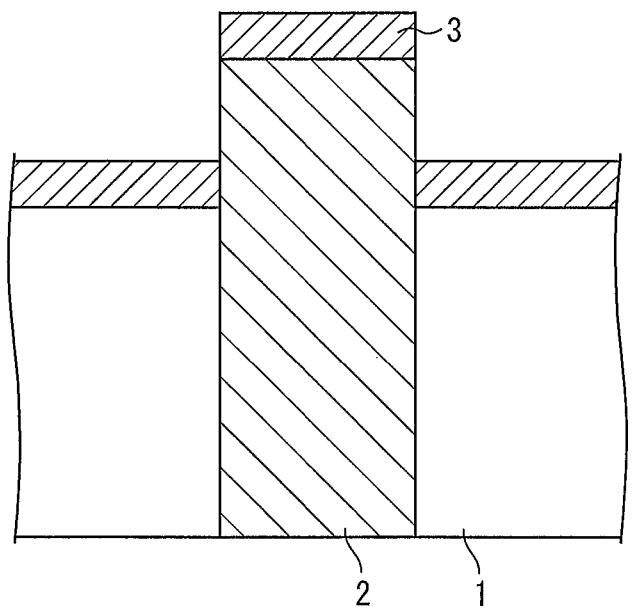
FIG. 10 is a view illustrating a structure in which an electrically conductive member excessively protrudes from a housing.

Note, however, that, in a case where the electrically conductive member 2 excessively protrudes from the housing 1, another problem may occur. FIG. 10 is a view illustrating a structure in which the electrically conductive member 2 excessively protrudes from the housing 1. In a structure in which the electrically conductive member 2 excessively protrudes from the housing 1 as illustrated in FIG. 10, the electrically conductive pattern 3 is broken off due to a height difference between the electrically conductive member 2 and the housing 1. In view of this, it is preferable to provide a projection 1b on the housing 1 so that the projection 1b surrounds a lateral surface of the electrically conductive member 2 as illustrated in FIG. 11.

Figure 11:
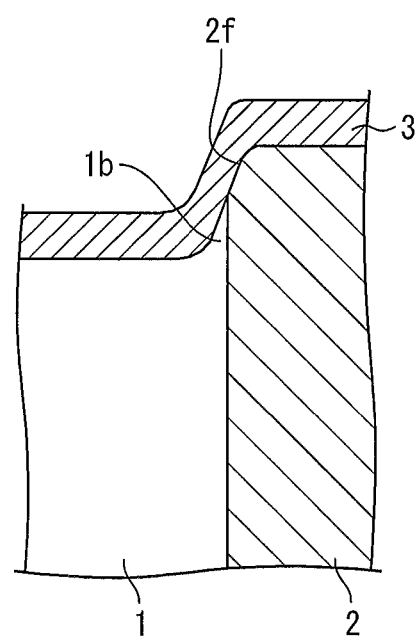
FIG. 11 is a view illustrating a structure in which a housing 1 has a projection 1b.

FIG. 11 is a view illustrating a structure in which the housing 1 has the projection 1b. The housing 1 has the projection 1b which (i) is provided at a part making contact with the electrically conductive member 2 and (ii) protrudes toward the electrically conductive pattern 3 as compared to surroundings of the projection 1b (see FIG. 11). With the configuration, even in a case where the electrically conductive member 2 protrudes toward the electrically conductive pattern 3 as compared to the housing 1, it is possible to reduce a height difference between the housing 1 and the electrically conductive member 2. This makes it possible to suitably inhibit the electrically conductive pattern 3 from being broken off due to such a height difference.

Figure 12:
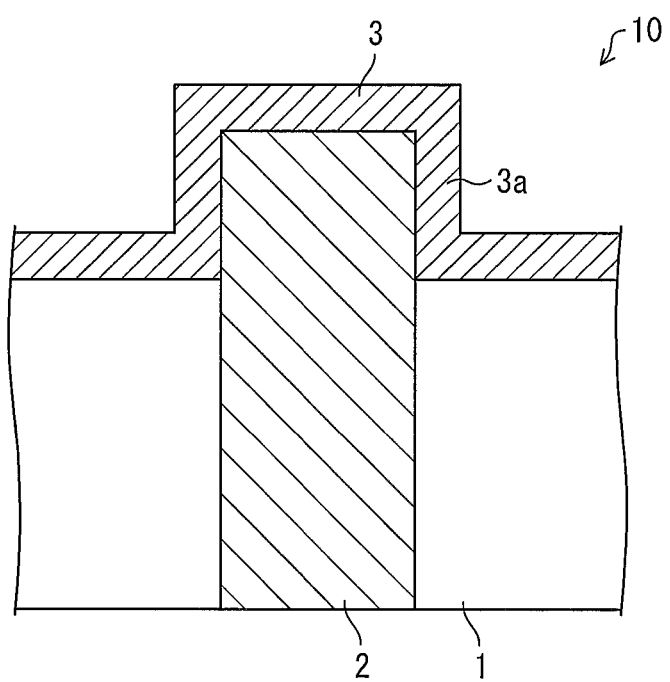
FIG. 12 is a view illustrating a configuration in which an electrically conductive pattern is provided also to a lateral surface of an electrically conductive member.

Alternatively, in a case where the electrically conductive member 2 excessively protrudes from the housing 1, a breaking-off of the electrically conductive pattern 3 can be inhibited by providing an electrically conductive pattern 3a on a lateral surface of the electrically conductive member 2 (see FIG. 12).

Alternatively, in an embodiment, the recess can be filled with an electrically conductive material before the electrically conductive pattern 3 is formed, in order to inhibit the electrically conductive pattern 3 from being broken off due to the recess.

Embodiment 3

In Embodiment 1, a positional relation between the electrically conductive member 2 and the housing 1 may vary depending on unevenness in manufacturing. Therefore, even in a case where the housing 1 and the electrically conductive member 2 are intended to be arranged to have respective surfaces which are flush with each other, the electrically conductive member 2 can become excessively higher than the housing 1 depending on a degree of unevenness. This can cause the electrically conductive pattern 3 to be broken off. In view of this, in Embodiment 3 described below, it is possible to suitably inhibit the electrically conductive pattern 3 from being broken off due to unevenness in manufacturing.

Figure 13:
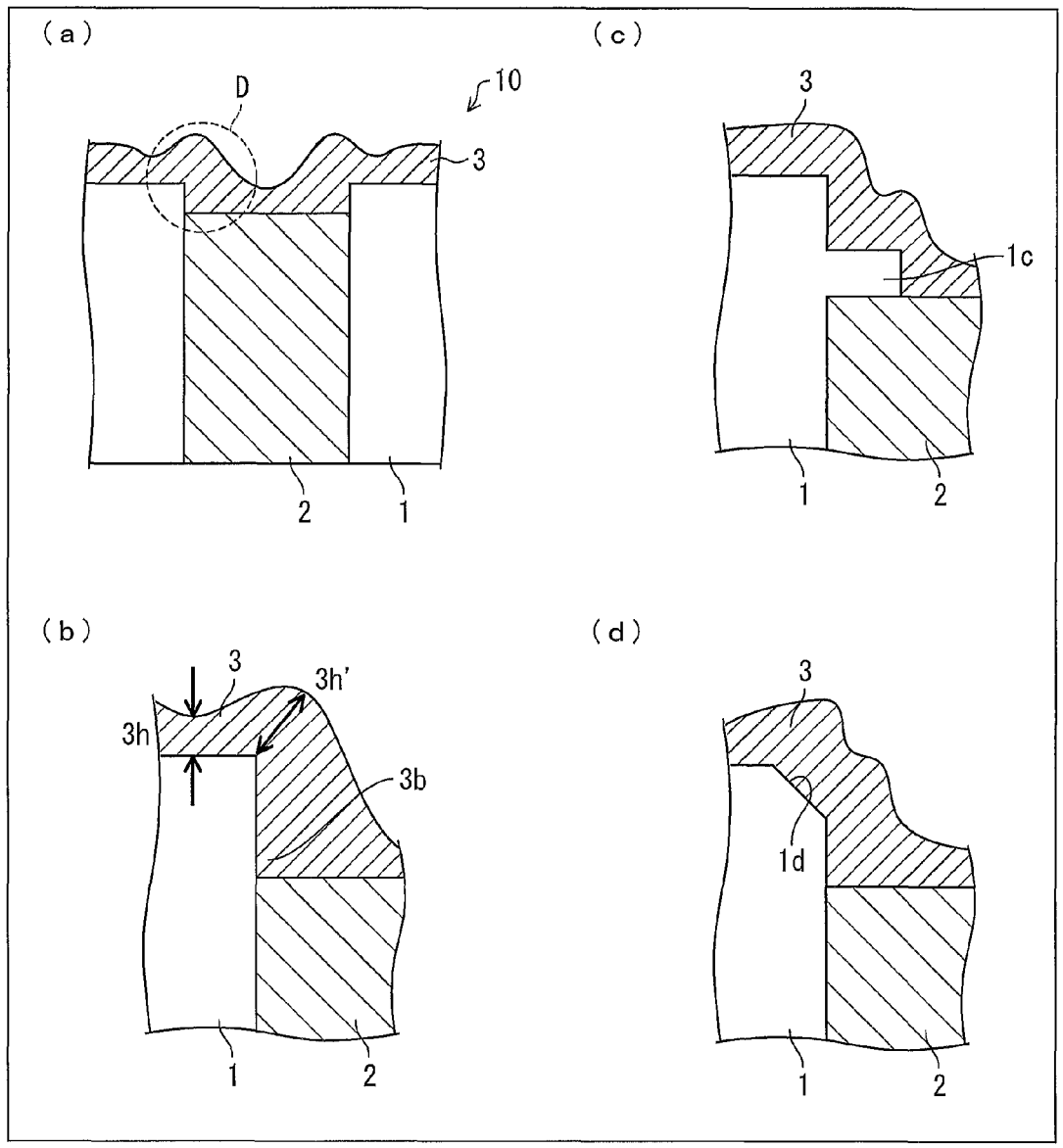
FIG. 13 is a view illustrating a structure in accordance with an embodiment (Embodiment 3) of the present invention.

FIG. 13 is a view illustrating a structure 10 in accordance with an embodiment (Embodiment 3) of the present invention. According to the structure 10 in accordance with Embodiment 3, the electrically conductive member 2 is depressed with respect to the housing 1 on the side on which the electrically conductive pattern 3 is provided (see (a) of FIG. 13). Even in a case where the electrically conductive member 2 is thus depressed with respect to the housing 1, the electrically conductive pattern 3 is not broken off. The following description will discuss reasons for this.

(b) of FIG. 13 is a magnified view of a part D in (a) of FIG. 13. Here, an electrically conductive pattern tends to pile up at an edge part due to a surface tension. Therefore, in a case where (i) the electrically conductive pattern 3 is formed by applying an electrically conductive paste and (ii) the electrically conductive member 2 is depressed with respect to the housing 1, a thickness 3h of the electrically conductive pattern 3 located above the housing 1 becomes, due to a surface tension, smaller than a thickness 3h' of the electrically conductive pattern 3 located in the vicinity of a boundary surface between the housing 1 and the electrically conductive member 2 which form a height-different part (see (b) of FIG. 13). Therefore, even in a case where the electrically conductive member 2 is depressed with respect to the housing 1 in advance, the electrically conductive pattern 3 is not broken off.

According to the structure 10 of Embodiment 3, the electrically conductive member 2 is depressed with respect to the housing 1 in advance on the side on which the electrically conductive pattern 3 is provided. With the configuration, even in a case where unevenness in positional relation between the electrically conductive member 2 and the housing 1 becomes large in manufacturing, it is possible to (i) prevent the electrically conductive member 2 from becoming excessively higher than the housing 1 and accordingly (ii) suitably inhibit the electrically conductive pattern 3 from being broken off.

More preferably, the housing 1 can overhangs the electrically conductive member 2. Specifically, the housing 1 can be configured to have a covering part 1c that covers a periphery of the surface 2a that faces the electrically conductive pattern 3 (see (c) of FIG. 13). According to the arrangement, three different heights, i.e., heights of respective of the housing 1, the covering part 1c, and the electrically conductive member 2 are formed on the electrically conductive pattern side. This allows an increase in thickness of the electrically conductive pattern 3 in the part forming the height differences, as compared to the arrangement in which no covering part is provided and two different heights, i.e., heights of respective of the housing 1 and the electrically conductive member 2 are formed on the electrically conductive pattern 3 side. This makes it possible to suitably inhibit the electrically conductive pattern 3 from being broken off.

Alternatively, the housing 1 can be configured to have a shape having a hollow whose periphery is formed by a slant, as illustrated in (d) of FIG. 13.

Embodiment 4

According to Embodiment 1, in a case where the electrically conductive pattern 3 is formed by applying an electrically conductive paste, it is necessary to dry the electrically conductive paste at a high temperature in order to improve an adhesive strength at a contacting boundary between the electrically conductive member 2 and the electrically conductive pattern 3. However, in a case where the drying temperature is high, a material (e.g., dielectric resin) constituting the housing 1 may be melted, and is accordingly bent, distorted, or the like. In a case where a high-temperature tolerance of the material (e.g., dielectric resin) constituting the housing 1 is improved, a fixing strength between the housing 1 and the electrically conductive pattern 3 may be decreased. The adhesive strength between the electrically conductive member and the electrically conductive pattern can be improved by increasing a content (mixed ratio) of a binder resin in the electrically conductive paste. However, in a case where the content of the binder resin is high, a resistance of the electrically conductive paste is increased and accordingly the electrically conductive paste may become less likely to pass an electric signal. In order to balance these phenomena with each other, the adhesive strength between the electrically conductive member 2 and the electrically conductive pattern 3 may be sacrificed to some extent. In view of this, according to Embodiment 4 described below, it is possible to suitably improve the adhesive strength between the electrically conductive member 2 and the electrically conductive pattern 3, regardless of a temperature for drying the electrically conductive paste and of a composition of the electrically conductive paste.

Figure 14:
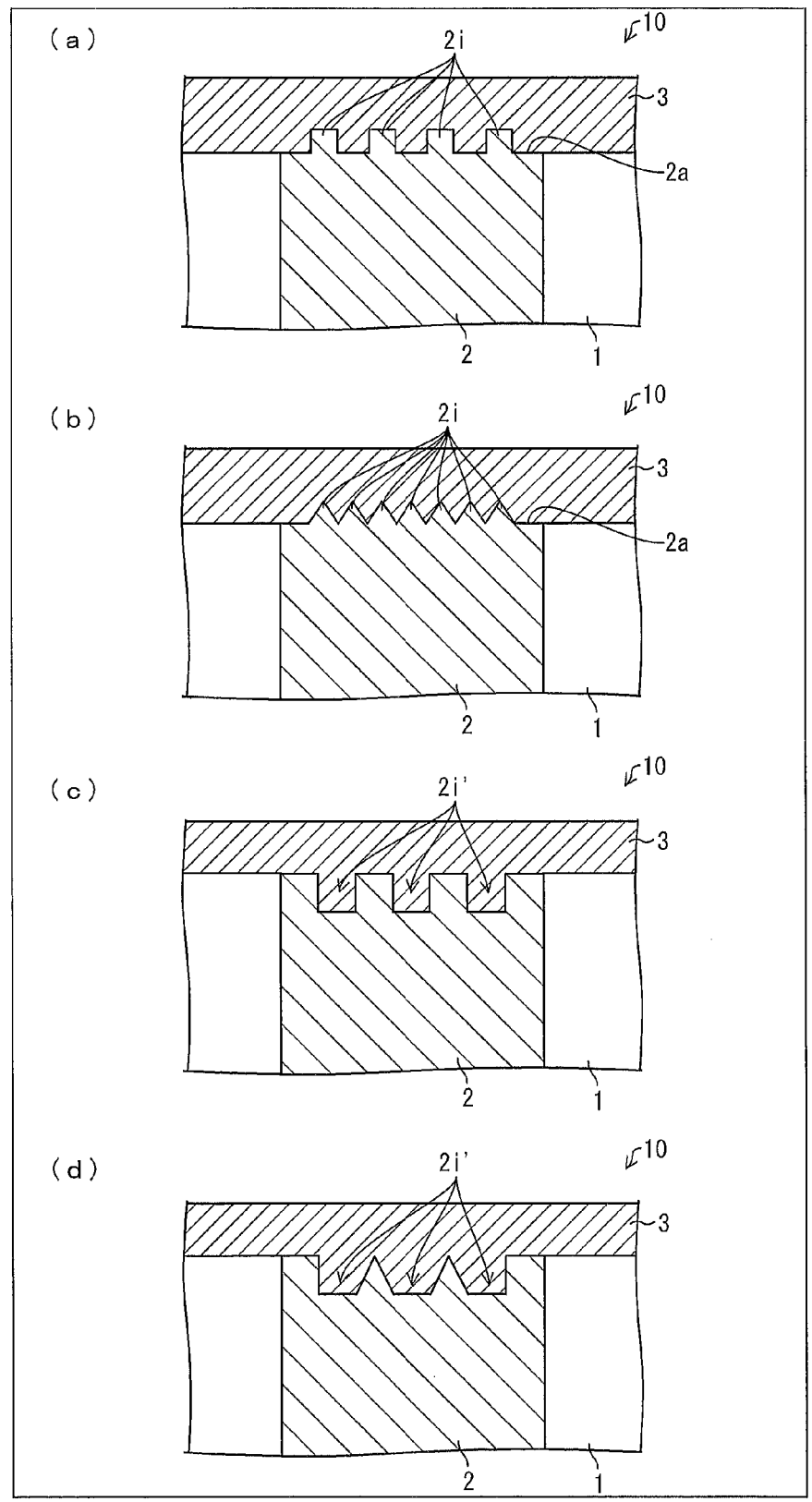
FIG. 14 is a cross-sectional view schematically illustrating a configuration of a structure in accordance with an embodiment (Embodiment 4) of the present invention.

FIG. 14 is a cross-sectional view schematically illustrating a configuration of a structure in accordance with an embodiment (Embodiment 4) of the present invention. According to Embodiment 4, asperities are provided (i.e., projections 2i or depressions 2i' are provided) on the surface 2a of the electrically conductive member 2 which surface 2a is in content with the electrically conductive pattern 3 (see (a) through (d) of FIG. 14). Note that, in this specification, "asperities are provided" means that at least one projection or at least one depression is provided. The following description will discuss a case where projections are provided. Note, however, that a similar description applies to a case where depressions are provided. According to the configuration in accordance with Embodiment 4, a contacting area between the electrically conductive member 2 and the electrically conductive pattern 3 is increased, and it is therefore possible to improve an electrical adhesive strength (i.e., conductivity) and a mechanical adhesive strength (fixing strength) between the electrically conductive member 2 and the electrically conductive pattern 3.

This makes it possible to improve the adhesive strength regardless of the temperature at which the electrically conductive paste is dried. This broadens a range of choice of (i) a material constituting the housing 1 and (ii) an electrically conductive paste. In general, as a content of a binder resin in an electrically conductive paste becomes higher, mechanical fixation of the electrically conductive paste to a dielectric substance or to an electric conductor becomes stronger. However, in a case where the content of the binder resin is high, a resistance of the electrically conductive paste is increased and accordingly the electrically conductive paste becomes less likely to pass an electric signal. On the other hand, in a case where a content of metal powder becomes higher, the mechanical fixation is weakened but the resistance of the electrically conductive paste itself is decreased, and accordingly the electrically conductive paste becomes more likely to pass an electric signal. Therefore, according to Embodiment 4, the adhesive strength between the electrically conductive paste and the electrically conductive member can be improved. This contributes (i) to a reduction in content of the binder resin in the electrically conductive paste and (ii) to a decrease in resistance of the electrically conductive paste.

In an embodiment, a depth of the asperities (e.g., a height of the projections 2i) is shallower (shorter) than a thickness of the electrically conductive pattern 3 (see FIG. 14). Therefore, the electrically conductive pattern 3 is not divided even in a location in which the asperities (e.g., the projections 2i) are provided. This makes it possible to successfully secure a conductivity in the electrically conductive pattern 3.

Figure 15:
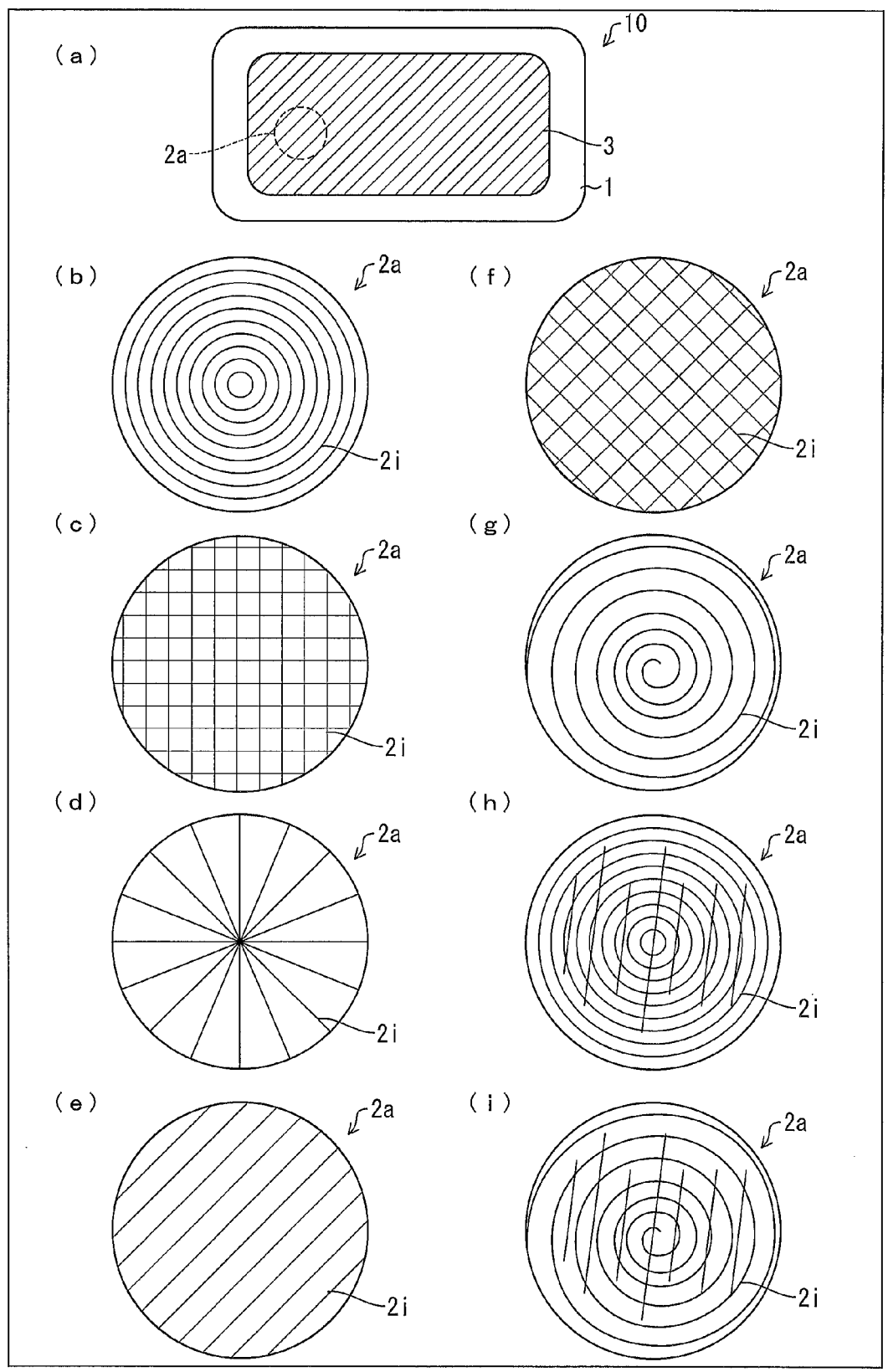
FIG. 15 is a view illustrating an example arrangement of asperities in a structure in accordance with an embodiment (Embodiment 4) of the present invention.

FIG. 15 is a view illustrating an example arrangement of the asperities. In an embodiment of the structure 10, the electrically conductive paste 3 is formed in a partial area of a surface of the housing 1, and the electrically conductive member 2 is embedded in a further partial area of the area in which the electrically conductive paste 3 is formed (see (a) of FIG. 15). Further, the asperities are provided on the surface 2a of the electrically conductive member.

(b) through (i) of FIG. 15 illustrate variations of a pattern of the asperities (i.e., projections 2i) arranged on the surface 2a. The pattern of the asperities is not limited to a particular one, and various aspects can be employed.

For example, an arrangement can be employed in which the projections 2i and depressions are concentrically and alternately formed (see (b) of FIG. 15). In other words, the surface 2a can have asperities which are concentrically arranged. Note that, in this specification, the term "concentrically" indicates a state in which a plurality of circles having respective different diameters are nested, and the plurality of circles do not necessarily need to be arranged at equal spaces.

Alternatively, an arrangement can be employed in which the projections 2i are arranged to form a texture (see (c) of FIG. 15). In other words, the surface 2a can have asperities which are arranged to form a texture. Note that, in this specification, the term "texture" indicates a repetitive pattern formed by elements which are regularly arranged, and the elements do not necessarily need to be arranged at equal intervals.

Alternatively, an arrangement can be employed in which the projections 2i and depressions are radially and alternately formed (see (d) of FIG. 15). In other words, the surface 2a can have asperities which are radially arranged. Note that, in this specification, the term "radially" indicates a state in which a plurality of lines extend in respective different directions from a center to a periphery, and any adjacent two of the plurality of lines do not necessarily need to form an equal angle.

Alternatively, an arrangement can be employed in which a plurality of parallel hairlines (grooves) are formed (see (e) of FIG. 15). In other words, the surface 2a can have asperities which are arranged in a striped pattern. Note that, in this specification, the term "striped pattern" indicates a state in which a plurality of lines are arranged side by side, and the plurality of straight lines do not necessarily need to be arranged at equal spaces. Moreover, the plurality of lines do not necessarily need to be arranged in parallel with each other.

Alternatively, an arrangement can be employed in which a plurality of hairlines are additionally formed so as to perpendicularly intersect with the hairlines which are arranged as illustrated in (e) of FIG. 15 (see (f) of FIG. 15). In other words, the surface 2a can have asperities which are arranged in a lattice pattern. Note that, in this specification, the term "lattice pattern" indicates a pattern formed by two or more sets of lines, any one of the sets of lines intersecting with the other sets of lines. Further, adjacent lines do not need to be arranged at equal spaces. Moreover, the lines do not need to perpendicularly intersect with each other, and do not need to intersect with each other at equal angles.

Alternatively, an arrangement can be employed in which the projection 2i is formed in a spiral pattern (see (g) of FIG. 15). In other words, the surface 2a can have asperities which are arranged in a spiral pattern. Note that adjacent rolls in the spiral pattern do not need to be arranged at equal spaces.

Alternatively, an arrangement can be employed in which a plurality of patterns of asperities are combined. That is, an arrangement can be employed which is formed by combining a plurality of shapes selected from shapes such as (i) the shape in which the asperities are concentrically arranged, (ii) the shape in which the asperities are arranged to form a texture, (iii) the shape in which the asperities are arranged in a striped pattern, (iv) the shape in which the asperities are arranged in a lattice pattern, and (v) the shape in which the asperities are arranged in a spiral pattern.

For example, an arrangement can be employed in which grooves 2l, which are arranged in parallel with each other at random intervals, are provided (i) on a pattern in which the projections 2i are concentrically arranged on the surface 2a (see (h) of FIG. 15) or (ii) on a pattern in which the projection 2i is formed in a spiral pattern on the surface 2a (see (i) of FIG. 15). By thus employing a pattern having random intervals and thus combining two or more shapes, it is possible to further increase the contacting area between the electrically conductive member and the electrically conductive pattern and to further improve an electrical adhesive strength (conductivity) and a mechanical adhesive strength (fixing strength) between the electrically conductive member and the electrically conductive pattern.

The concentric pattern and the spiral pattern are preferable because the patterns are easy to manufacture. For example, such a pattern can be easily formed by forming a groove(s) on the surface 2a while rotating the electrically conductive member 2 around an axis.

Figure 16:
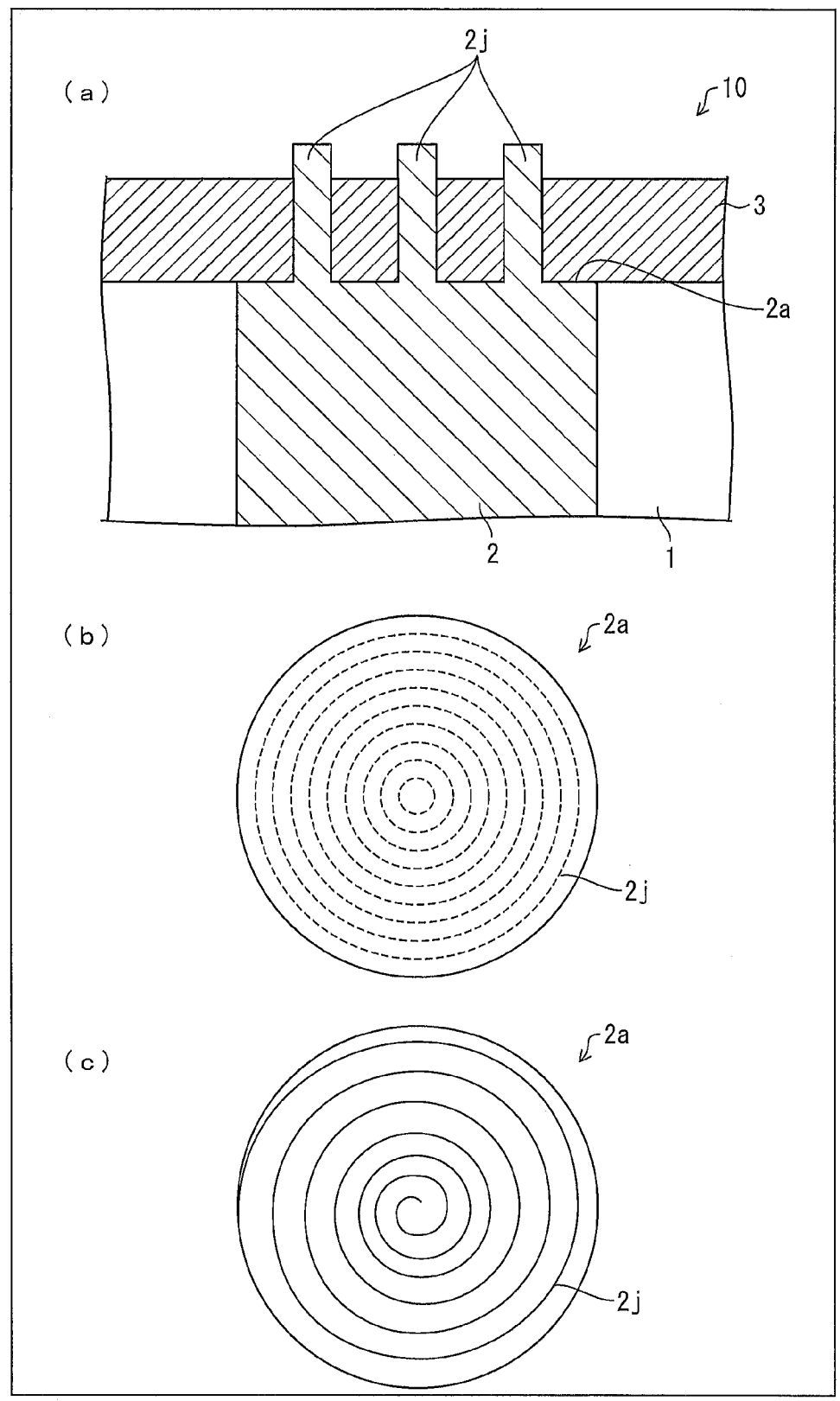
FIG. 16 is a view illustrating an example arrangement of asperities in a structure in accordance with an embodiment (Embodiment 4) of the present invention.

In an embodiment, asperities (projections 2j) which are deeper than the thickness of the electrically conductive pattern 3 can be provided (see (a) of FIG. 16). In this case, the asperities (i.e., the projections 2j) are discontinuously provided so as not to break up the electrically conductive pattern 3 (see (b) of FIG. 16). As such, even in a case where the asperities (i.e., the projections 2j) which are deeper than the thickness of the electrically conductive pattern 3 are provided, it is possible to secure conductivity in the electrically conductive pattern 3. Further, since the electrically conductive pattern 3 is thinner than the projections on the electrically conductive member 2, it is possible to prevent the electrically conductive pattern from being peeled off due to scratches by such projections. In this case, other asperities (i.e., projections 2i), which are shallower than the thickness of the electrically conductive pattern 3, can be further provided.

Alternatively, in a case where the asperities (i.e., the projection 2j) are formed in a spiral pattern (see (c) of FIG. 16), the electrically conductive pattern 3 is not broken up, i.e., a center and a periphery of the electrically conductive pattern 3 are continuous, and it is therefore possible to secure conductivity in the electrically conductive pattern 3. Moreover, as with the configuration illustrated in (b) of FIG. 16, it is possible to prevent the electrically conductive pattern 3 from being peeled off. Note that the projection(s) 2j can be arranged in a pattern other than the spiral pattern, provided that such a pattern is a simple open curve that has no self-intersection. In a case where the asperities are arranged in such a pattern, the electrically conductive pattern 3 is not broken off, and it is therefore possible to secure conductivity in the electrically conductive pattern 3. Note that the simple open curve encompasses a polygonal curve.

Figure 17:
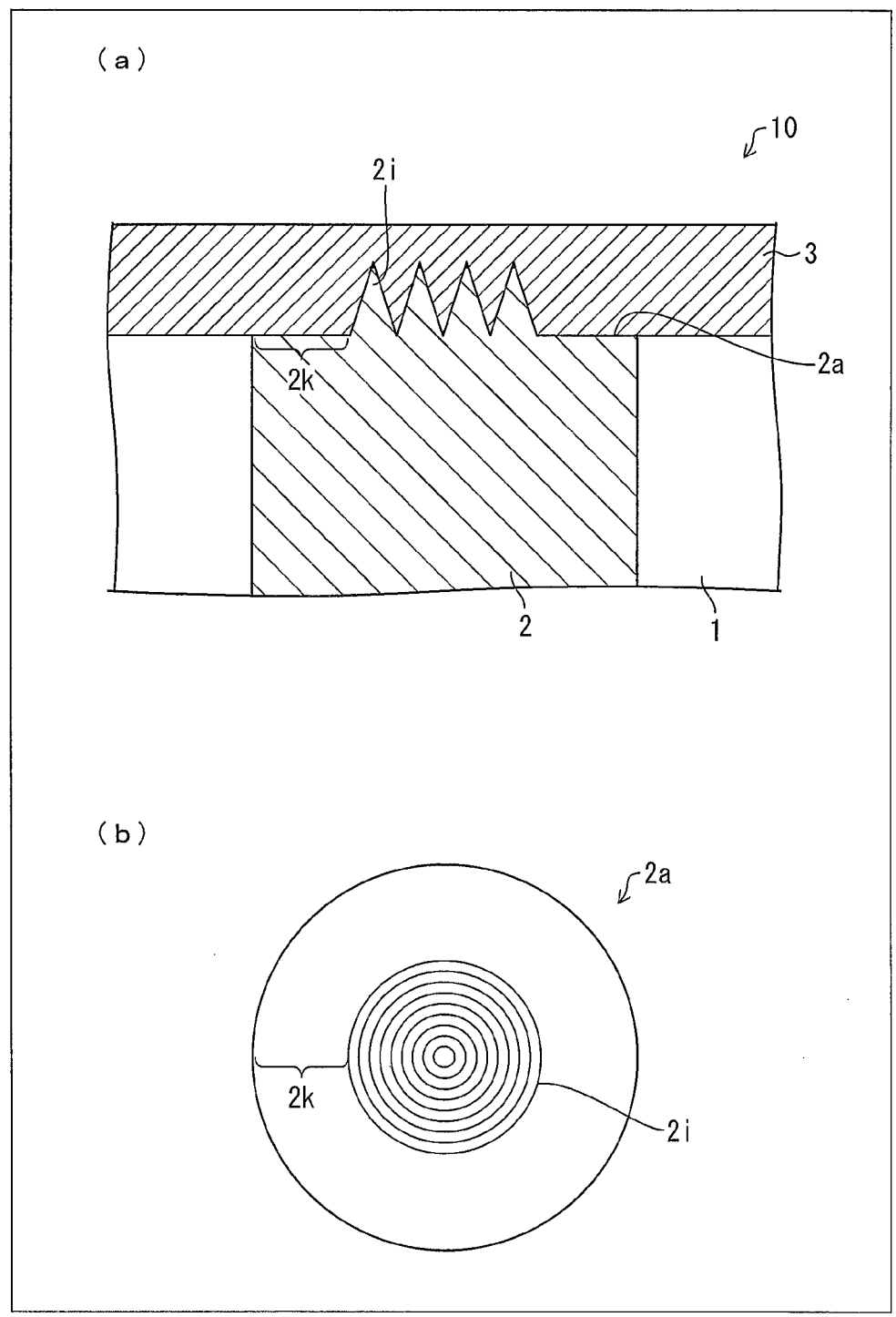
FIG. 17 is a view illustrating an example arrangement of asperities in a structure in accordance with an embodiment (Embodiment 4) of the present invention.

Note that, in an embodiment, a flat region 2k can be provided in a periphery of the surface 2a (see FIG. 17). The flat region 2k has a width which is larger than an average depth of the asperities, and no asperities are provided in the flat region 2k. By thus providing the flat region 2k, it is possible to prevent a steep change in surface shape between a region (i.e., the surface 1a) on top of the housing 1 and a region (i.e., the surface 2a) on top of the electrically conductive member 2. This makes it possible to achieve a good connection between the regions lying under the electrically conductive pattern 3.

Figure 18:
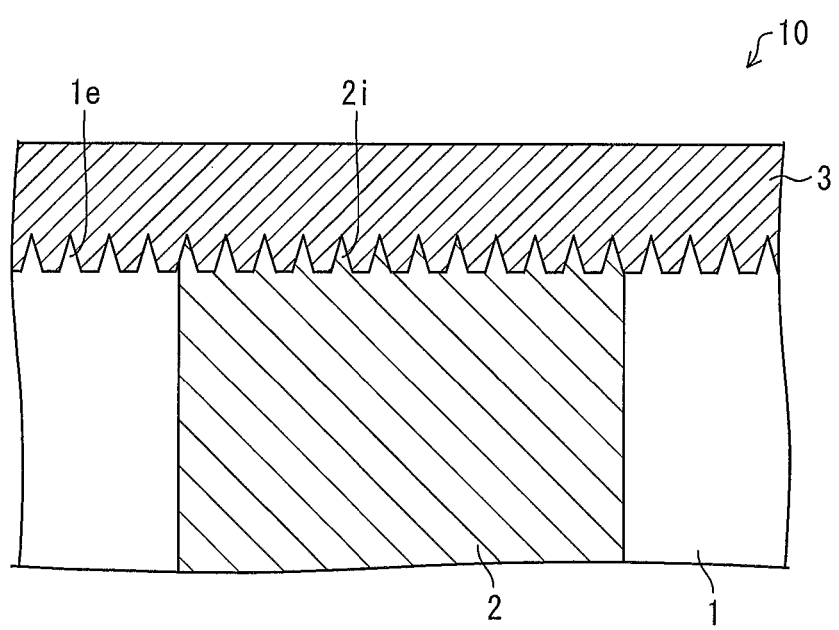
FIG. 18 is a view illustrating an example arrangement of asperities in a structure in accordance with an embodiment (Embodiment 4) of the present invention.

Alternatively, in an embodiment, for example, asperities (e.g., projections 1e) can be provided on the surface of the housing 1 which surface is in contact with the electrically conductive pattern 3 (see FIG. 18). According to the configuration, a contacting area is increased between the housing 1 and the electrically conductive pattern 3, and it is therefore possible to improve a mechanical adhesive strength (fixing strength) between the housing 1 and the electrically conductive pattern 3.

Embodiment 5

The electrically conductive member 2 and the housing 1 are made of respective different materials, and are therefore different from each other in characteristics such as an allowable temperature and an affinity with an electrically conductive paste. Therefore, a preferable combination of conditions (such as a material of the housing 1, a composition of the electrically conductive paste, and a drying condition of the electrically conductive paste) varies depending on whether (i) a fixation between the electrically conductive pattern 3 and the housing 1 is prioritized or (ii) a fixation between the electrically conductive pattern 3 and the electrically conductive member 2 is prioritized. In view of this, it is necessary to find a compromise between those cases. According to Embodiment 5 described below, it is possible to successfully secure both (i) the fixation between the electrically conductive pattern 3 and the housing 1 and (ii) the fixation between the electrically conductive pattern 3 and the electrically conductive member 2.

Figure 19:
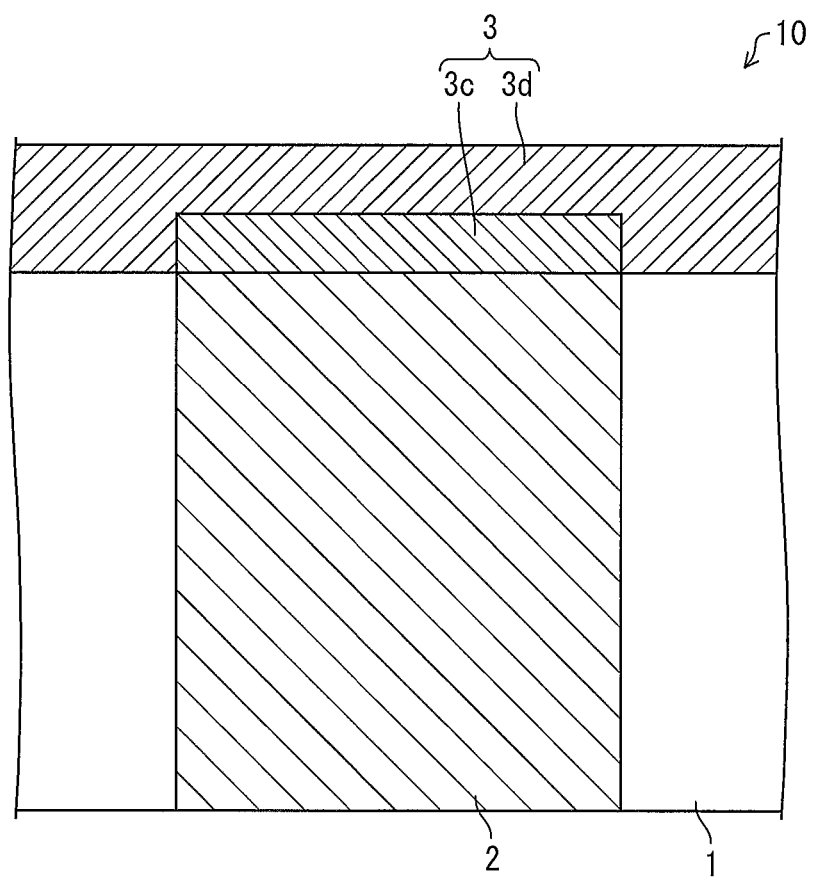
FIG. 19 is a view illustrating a configuration of a structure in accordance with an embodiment (Embodiment 5) of the present invention.

FIG. 19 is a view illustrating a configuration of a structure in accordance with an embodiment (Embodiment 5) of the present invention. The electrically conductive pattern 3 is made up of an electrically conductive pattern 3c (first electrically conductive film) and an electrically conductive pattern 3d (second electrically conductive film) (see FIG. 19). The electrically conductive pattern 3c is formed by applying a first electrically conductive paste (first electrically conductive material) to the electrically conductive member 2. The electrically conductive pattern 3d is formed by applying a second electrically conductive paste (second electrically conductive material) to the housing 1 and to the electrically conductive pattern 3c.

The electrically conductive pattern 3c formed on the electrically conductive member 2 can be made different from the electrically conductive pattern 3d formed on the housing 1 in conditions such as (i) a composition of the electrically conductive film and (ii) a forming condition (i.e., a condition of drying the electrically conductive paste). This makes it possible to employ conditions such as a composition and a forming condition which are suitable for each of the electrically conductive patterns 3c and 3d. It is therefore possible to successfully secure both (i) the fixation between the electrically conductive pattern 3 and the housing 1 and (ii) the fixation between the electrically conductive pattern 3 and the electrically conductive member 2. Note that no particular problem occurs in fixation between the electrically conductive pattern 3c and the electrically conductive pattern 3d because the electrically conductive patterns 3c and 3d are both made of respective electrically conductive pastes and have remarkably similar compositions and characteristics, as compared to a difference between the housing 1 and the electrically conductive member 2 or a difference between (i) the electrically conductive pattern 3 and (ii) the housing 1 and the electrically conductive member 2.

Figure 20:
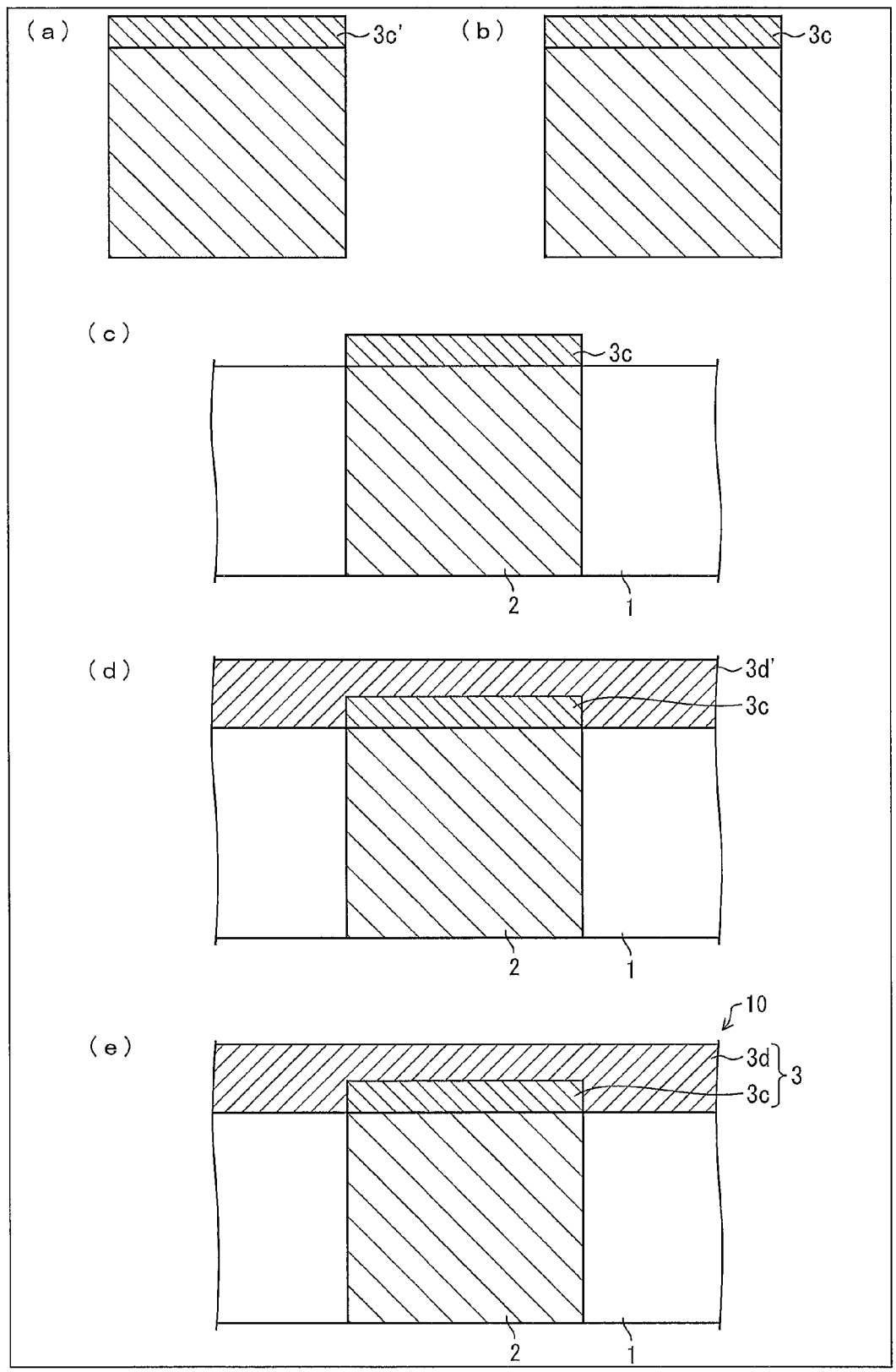
FIG. 20 is a view illustrating an example of each step in a method for manufacturing a structure in accordance with an embodiment (Embodiment 5) of the present invention.

FIG. 20 is a view illustrating an example of a method for manufacturing a structure in accordance with Embodiment 5. An embodiment can be employed as illustrated in FIG. 20 in which, (i) in a first step, an electrically conductive pattern 3c is formed by applying a first electrically conductive paste to an electrically conductive member 2 and then the electrically conductive member 2, on which the electrically conductive pattern 3c has been formed, is combined with a housing 1 or the electrically conductive member 2 and the housing 1 are molded in one piece and, (ii) in a second step, a second electrically conductive paste is applied to the housing 1 and to the electrically conductive pattern 3c so as to form an electrically conductive pattern 3d.

Specifically, a first electrically conductive paste 3c' is applied to the electrically conductive member 2 (see (a) of FIG. 20) so as to form an electrically conductive pattern 3c on the electrically conductive member 2 (see (b) of FIG. 20). Then, the obtained electrically conductive member 2 is combined with the housing 1 or the obtained electrically conductive member 2 and the housing 1 are molded in one piece (see (c) of FIG. 20). Subsequently, a second electrically conductive paste 3d' is applied to the housing 1 and to the electrically conductive pattern 3c (see (d) of FIG. 20) so as to form an electrically conductive pattern 3d on the housing 1 and on the electrically conductive pattern 3c (see (e) of FIG. 20).

By thus manufacturing the structure 10, the electrically conductive pattern 3c can be formed on the electrically conductive member 2 before the electrically conductive member 2 is incorporated in the housing 1. This makes it possible to select a condition of forming the electrically conductive pattern 3c without considering an influence on the housing 1. This allows an improvement in bonding force of the electrically conductive pattern 3c to the electrically conductive member 2.

In a case where the electrically conductive member 2 and the housing 1 are integrally molded (by insert molding) in the first step, such integral molding can be easily carried out because a top and a bottom of the electrically conductive member 2 are easily identified because the electrically conductive pattern 3c has been formed on the electrically conductive member 2.

Note that, in the example illustrated in FIG. 20, it is preferable that the electrically conductive pattern 3c and the electrically conductive pattern 3d have identical compositions. This allows an improvement in affinity between the electrically conductive pattern 3c and the electrically conductive pattern 3d, and it is therefore possible to improve an electrical adhesive strength (conductivity) and a mechanical adhesive strength (fixing strength) between the electrically conductive patterns.

Moreover, it is preferable that a condition of forming the electrically conductive pattern 3c in the first step is different from a condition of forming the electrically conductive pattern 3d in the second step. This makes it possible to separately set (i) the condition of forming the electrically conductive pattern 3c on the electrically conductive member 2 and (ii) the condition of forming the electrically conductive pattern 3d on the housing 1. It is therefore possible to successfully; improve bonding force of the electrically conductive pattern 3 to at least any of the housing 1 and the electrically conductive member 2.

Examples of the conditions to be made different encompass at least any of a temperature condition and a time condition. The temperature and the time are important factors for forming an electrically conductive film, and it is therefore possible to successfully secure bonding of the electrically conductive pattern to both the housing and the electrically conductive member.

It is preferable that the electrically conductive pattern 3c is formed in the first step under a condition in which a temperature is high and a time is long, and the electrically conductive pattern 3d is formed in the second step under a condition in which a temperature is low and a time is short. The housing 1 is more likely to be influenced by the temperature, and it is therefore preferable to form the electrically conductive pattern 3d at the low temperature for the short time. The electrically conductive member 2 tends to have a high heat resistance, and it is therefore preferable to form the electrically conductive pattern 3c at the high temperature for the long time in order to improve adhesiveness.

Figure 21:
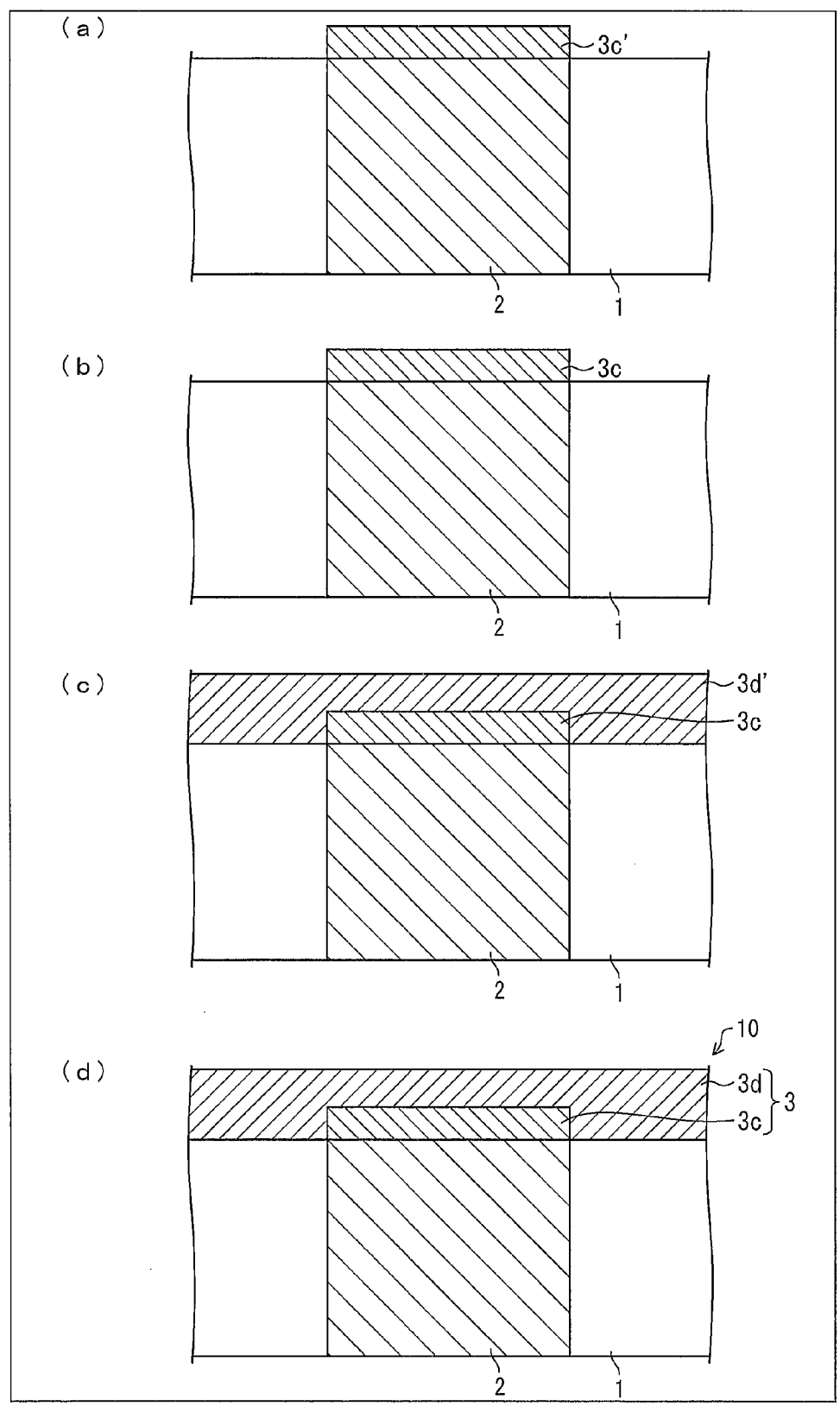
FIG. 21 is a view illustrating an example of each step in a method for manufacturing a structure in accordance with an embodiment (Embodiment 5) of the present invention.

FIG. 21 is a view illustrating another example of a method for manufacturing a structure in accordance with Embodiment 5. An embodiment can be employed as illustrated in FIG. 21 in which, in the second step, a first electrically conductive film is formed by applying a first electrically conductive material to the electrically conductive member and then a second electrically conductive film is formed by applying a second electrically conductive material to the housing and to the first electrically conductive film. In this case, it is assumed that an affinity between the first electrically conductive material and the electrically conductive member is higher than an affinity between the second electrically conductive material and the electrically conductive member.

Specifically, a first electrically conductive paste 3c' is applied to an electrically conductive member 2 which is embedded in a housing 1 (see (a) of FIG. 21) so as to form an electrically conductive pattern 3c on the electrically conductive member 2 (see (b) of FIG. 21). Subsequently, a second electrically conductive paste 3*d*' is applied to the housing 1 and to the electrically conductive pattern 3*c* (see (c) of FIG. 21) so as to form an electrically conductive pattern 3*d* on the housing 1 and on the electrically conductive pattern 3*c* (see (d) of FIG. 21).

As such, an affinity is high between the electrically conductive member 2 and the first electrically conductive paste which is applied to the electrically conductive member 2, and an affinity is high between the housing 1 and the second electrically conductive paste which is applied to the housing 1. This makes it possible to suitably and successfully fix the electrically conductive pattern 3 to both the housing 1 and the electrically conductive member 2.

In the example illustrated in FIG. 21, a condition of forming the electrically conductive pattern 3*c* can be different from a condition of forming the electrically conductive pattern 3*d*, as with the example illustrated in FIG. 20. Examples of the conditions to be made different encompass at least any of a temperature condition and a time condition. This makes it possible to separately set (i) the condition of forming the electrically conductive pattern 3*c* on the electrically conductive member 2 and (ii) the condition of forming the electrically conductive pattern 3*d* on the housing 1. It is therefore possible to successfully improve bonding force of the electrically conductive pattern 3 to at least any of the housing 1 and the electrically conductive member 2.

(Comparison with Other Configuration)

Figure 22:
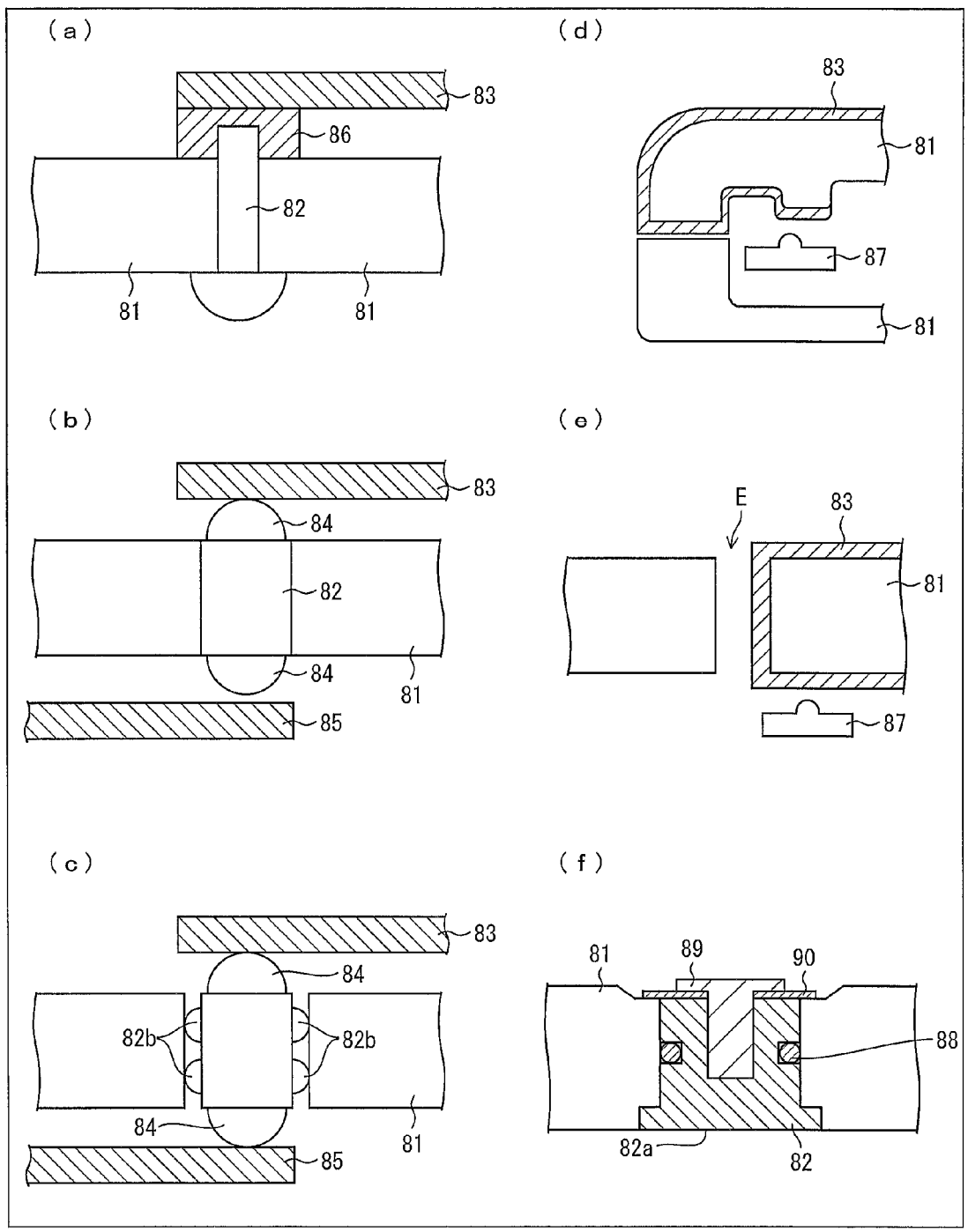
FIG. 22 is a view illustrating other various configurations.

FIG. 22 is a view illustrating other configurations, which are considered by the inventors of the present invention for realizing a function equivalent to that of the structure 10.

(a) of FIG. 22 illustrates a configuration in which an electrically conductive pin 82 penetrates a resin part 81 and protrudes, and the protruded part is adhered to a metal plate 83 by an electrically conductive adhesive agent 86. According to the configuration, the adhesive agent 86 needs to have a thickness for covering the protruded part. Moreover, a volume of the adhesive agent 86 needs to be secured enough to obtain a strength for fixing the resin part 81 to the metal plate 83. This causes a problem that a reduction in thickness of the structure is difficult to achieve.

(b) of FIG. 22 illustrates a configuration in which an electrically conductive pin 82, which is, embedded in a resin part 81, is connected via respective springs 84 with metal plates 83 and 85 which are provided above and below the resin part 81, respectively (note that the electrically conductive pin 82 can be connected with the metal plate 85 via a protrusion instead of the spring). According to the configuration, the metal plate 83 needs to be thick enough to secure rigidity so as not to be bent by the spring 84. Therefore it is difficult to reduce a thickness of the structure because the spring 84 also has its thickness.

A configuration illustrated in (c) of FIG. 22 is similar to that illustrated in (b) of FIG. 22, except that protrusions 82*b* are provided on a lateral surface of the electrically conductive pin 82 so that the protrusions 82*b* are embedded in the resin part 81. The configuration has a problem in which a waterproof property between the resin part 81 and the electrically conductive pin 82 is deteriorated, in addition to a problem similar to that of the configuration illustrated in (b) of FIG. 22.

(d) of FIG. 22 illustrates a configuration in which an electrically conductive part 83 is drawn from outside of a housing 81 to inside the housing 81 via a lateral surface so that the electrically conductive part 83 is connected with a spring terminal 87. According to the configuration, in a case where the electrically conductive part 83 is configured by a print or an LDS (Laser Direct Structure), the electrically conductive part 83 is easily broken off at a part at which the electrically conductive part 83 is folded. On the other hand, in a case where the electrically conductive part 83 is configured by an MID (Molded Interconnect Device), a waterproof property is deteriorated at a part at which the conducting part 83 is drawn into the housing. In general, an interlocking part of the housing 81 has a complicated structure, and accordingly the electrically conductive part 83 is to have a complicated shape or the electrically conductive part 83 even cannot be provided in some cases. Even in a case where the electrically conductive part 83 can be provided, it is necessary to route the electrically conductive part 83 for a long distance. This causes a deterioration in performance in a case where the electrically conductive part 83 is used as an antenna.

(e) of FIG. 22 illustrates a configuration in which an opening E is provided in the housing 81 and a flexible printed circuit board 83 is passed through the opening E. This configuration is considerably restricted in shape. For example, in a case where the flexible printed circuit board 83 is used as an antenna, the flexible printed circuit board 83 is restricted by a location at which a power supply point is provided. Further, a waterproof property cannot be achieved.

(f) of FIG. 22 illustrates a configuration in which an electrically conductive pin 82 is embedded in a resin part 81, a nut metal plate 90 is fixed by a screw 89 on an appearance side, and a spring mounted on a substrate and the like are connected with an inner surface 82*a* of the electrically conductive pin 82. Note that a waterproofing ring 88 can be provided between a wall of the resin part 81 and the electrically conductive pin 82. This configuration needs to be formed by carrying out (i) fastening of the screw 89 together with the nut metal plate 90, (ii) caulking, and (iii) adhering (with use of a gasket, an electrically conductive adhesive agent, or an electrically conductive tape). In view of this, the nut metal plate 90 needs to be strong enough. Therefore, a degree of freedom in shape of the nut metal plate 90 is lowered.

As such, the structure 10 in accordance with the embodiments of the present invention is advantageous over the configurations illustrated in (a) through (f) of FIG. 22.

Note that the concrete embodiments discussed in the foregoing best mode for carrying out the invention serves solely to clarify the technical details of the present invention, which should not be narrowly interpreted within the limits of such concrete examples, but a person skilled in the art can employ variations within the spirit of the present invention, provided such variations do not exceed the scope of the patent claims set forth below.

(Main Points)

In order to attain the object, the structure of the present invention includes: a housing which is made of a dielectric substance; an electrically conductive member which is embedded in the housing so as to penetrate the housing; and an electrically conductive pattern which is provided on at least one of surfaces in which the electrically conductive member lies by penetrating the housing, the electrically conductive pattern being electrically connected with the electrically conductive member, the electrically conductive pattern being made up of an electrically conductive film which has no self-shape retention property.

According to the configuration, regions between which the housing is located can be suitably electrically connected with each other. The electrically conductive pattern can be used as an antenna or can be used to be electrically connected with a member which is provided in an area in which the electrically conductive pattern is provided. Here, according to the configuration, the electrically conductive pattern is made up of the electrically conductive film which has no self-shape retention property. This allows the electrically conductive pattern to be fixed in an arbitrary shape, and it is therefore possible to improve a degree of freedom in design.

According to the structure of the present invention, it is preferable that the electrically conductive pattern is formed by applying an electrically conductive paste to the at least one of surfaces.

According to the configuration, the electrically conductive pattern can be formed by applying the electrically conductive paste. It is therefore possible to make the electrically conductive pattern thin. Moreover, it is possible to easily form the electrically conductive pattern into a curved surface shape. This allows a further improvement in degree of freedom in design.

According to the structure of the present invention, it is preferable that the electrically conductive paste is an electrically conductive material having a viscosity and contains at least metal powder and a solvent; and the electrically conductive film formed by applying the electrically conductive paste is hardened by at least partially removing the solvent by drying the electrically conductive paste.

According to the configuration, the electrically conductive paste is hardened after the electrically conductive paste has been applied. This allows the electrically conductive film to be stably fixed to the housing and to the electrically conductive member.

According to the structure of the present invention, it is preferable that the electrically conductive pattern is formed by applying the electrically conductive paste to the at least one of surfaces by printing with use of a flexible printing plate.

According to the configuration, the electrically conductive paste is applied by the printing (such as flexographic printing, offset printing, silk-screen printing, or pad printing) with the use of the flexible printing plate. It is therefore possible to successfully print the electrically conductive pattern in accordance with the shapes of the housing and the like. This makes it possible also to contribute to, for example, mass production of the structure.

According to the structure of the present invention, the electrically conductive pattern can be made up of a flexible electrically conductive film.

According to the configuration also, it is possible to fix the electrically conductive pattern in an arbitrary shape, and this allows an improvement in degree of freedom in design.

The method of present invention for manufacturing a structure is a method for manufacturing a structure including (i) a housing which is made of a dielectric substance, (ii) an electrically conductive member, and (iii) an electrically conductive pattern which is made up of an electrically conductive film that has no self-shape retention property, the method including the steps of: (a) forming a part of the structure which includes the housing and the electrically conductive member, the electrically conductive member being embedded in the housing so as to penetrate the housing; and (b) providing, after the step (a), the electrically conductive pattern on at least one of surfaces, in which the electrically conductive member lies by penetrating the housing, so that the electrically conductive pattern is electrically connected with the electrically conductive member.

According to the configuration, the electrically conductive pattern is provided after the electrically conductive member is fixed to the housing. From this, even in a case where the electrically conductive pattern is made up of an electrically conductive film that has no self-shape retention property, the electrically conductive pattern can be provided on the housing and on the electrically conductive member without any problem. This is because, in the step (a), the electrically conductive member is embedded in the housing and therefore the electrically conductive pattern does not need to be fixed to the electrically conductive member, unlike the technique disclosed in Patent Literature 1. Moreover, the electrically conductive pattern itself is configured by the electrically conductive film which has no self-shape retention property, and it is therefore possible to fix the electrically conductive pattern in an arbitrary shape. This allows an improvement in degree of freedom in design.

According to the structure manufacturing method of the present invention, it is preferable that, in the step (b), an electrically conductive paste is applied to the at least one of surfaces.

According to the configuration, it is possible to form the electrically conductive pattern by applying the electrically conductive paste. This makes it possible to form an electrically conductive pattern such as a delicate pattern or a curved surface pattern, which is difficult to configure by a metal plate. This allows a further improvement in degree of freedom in design.

According to the structure manufacturing method of the present invention, it is preferable that the electrically conductive paste is an electrically conductive material having a viscosity and contains at least metal powder and a solvent; and the electrically conductive paste applied in the step (b) is hardened by at least partially removing the solvent by drying the electrically conductive paste.

According to the configuration, the applied electrically conductive paste can be hardened for a short time. This also contributes to stable mass production of the structure.

According to the structure manufacturing method of the present invention, it is preferable that, in the step (b), the electrically conductive paste is applied to the at least one of surfaces by printing with use of a flexible printing plate.

According to the configuration, the electrically conductive paste is applied by the printing (such as flexographic printing, offset printing, silk-screen printing, or pad printing) with the use of the flexible printing plate. It is therefore possible to successfully print the electrically conductive pattern in accordance with the shapes of the housing and the like. This makes it possible also to contribute to, for example, mass production of the structure.

According to the structure manufacturing method of the present invention, in the step (b), the electrically conductive pattern can be made up of a flexible electrically conductive film.

According to the configuration also, it is possible to fix the electrically conductive pattern in an arbitrary shape, and this allows an improvement in degree of freedom in design.

According to the structure manufacturing method of the present invention, the electrically conductive member can protrude from the housing toward the electrically conductive pattern.

A small curved surface (R) is often formed, for reasons of manufacturing, at an outer edge of the surface of the electrically conductive member, which surface is located on the side on which the electrically conductive pattern is provided. Therefore, in a case where the housing and the electrically conductive member are arranged so as to have respective surfaces that are flush with each other, the small curved surface is to be located below the surface of the housing so that a small recess is formed. In a case where such a small recess is formed, the electrically conductive pattern can be broken off above the recess.

Here, according to the configuration, the electrically conductive member protrudes from the housing toward the electrically conductive pattern, and accordingly the small curved surface is to be exposed. This prevents the small recess from being formed or, even if the small recess is formed, the small recess is to be quite small. It is therefore possible to suitably inhibit the electrically conductive pattern from being broken off.

According to the structure, it is preferable that the electrically conductive member has (i) a first surface making contact with the housing and (ii) a second surface which is adjacent to the first surface and on which the electrically conductive pattern is provided; a round part is formed at a boundary between the first surface and the second surface by rounding off a corner between the first surface and the second surface; and at least part of the round part protrudes from the housing toward the electrically conductive pattern.

In a case where the round part is formed by rounding off the corner of the electrically conductive member at the boundary between (i) the first surface making contact with the housing and (ii) the second surface which is adjacent to the first surface and on which the electrically conductive pattern is provided, the round part is to be located below the surface of the housing so that a small recess is formed. Such a round part is often formed inevitably for reasons of, for example, manufacturing. In a case where such a small recess is formed, the electrically conductive pattern can be broken off above the recess.

In view of this, according to the configuration, the round part at least partially protrudes from the housing toward the electrically conductive pattern. Therefore, the round part is to be exposed, and this prevents the small recess from being formed or, even if the small recess is formed, the small recess is to be quite small. This makes it possible to suitably inhibit the electrically conductive pattern from being broken off.

According to the structure, it is preferable that the entire round part protrudes from the housing toward the electrically conductive pattern.

According to the configuration, the entire round part is exposed, and accordingly no recess is formed. Therefore, it is possible to further suitably inhibit the electrically conductive pattern from being broken off.

According to the structure, a part of the housing, which part is making in contact with the electrically conductive member, can protrude toward the electrically conductive pattern as compared to surroundings of the part.

According to the configuration, even in a case where the electrically conductive member protrudes from the housing toward the electrically conductive pattern, it is possible to reduce a height difference between the housing and the electrically conductive member because the part of the housing, which part is making in contact with the electrically conductive member, protrudes toward the electrically conductive pattern as compared to surroundings of the part. This makes it possible to suitably inhibit the electrically conductive pattern from being broken off due to such a height difference.

According to the structure of the present invention, the electrically conductive member can be depressed with respect to the housing on a side on which the electrically conductive pattern is provided.

A positional relation between the electrically conductive member and the housing may vary depending on unevenness in manufacturing. Therefore, even in a case where the housing and the electrically conductive member are intended to be arranged to have respective surfaces which are flush with each other, the electrically conductive member can become excessively higher than the housing depending on a degree of unevenness. This can cause the electrically conductive pattern to be broken off.

Here, according to the configuration, the electrically conductive part is provided so as to be depressed with respect to the housing in advance. Therefore, even in a case where unevenness in manufacturing is large, it is possible to prevent the electrically conductive member from becoming excessively higher than the housing, and it is therefore possible to suitably inhibit the electrically conductive pattern from being broken off.

According to the structure, the housing can have a covering part that covers a periphery of a surface of the electrically conductive member which surface faces the electrically conductive pattern.

According to the configuration, three different heights, i.e., heights of respective of the housing, the covering part, and the electrically conductive member are formed on the electrically conductive pattern side. This allows an increase in thickness of the electrically conductive pattern in the part forming the height differences, as compared to a configuration in which no covering part is provided and two different heights, i.e., heights of respective of the housing and the electrically conductive member are formed on the electrically conductive pattern side. This makes it possible to suitably inhibit the electrically conductive pattern from being broken off.

According to the structure of the present invention, asperities can be provided on a surface of the electrically conductive member which surface is in contact with the electrically conductive pattern.

According to the configuration, a contacting area between the electrically conductive member and the electrically conductive pattern is increased, and it is therefore possible to improve an electrical adhesive strength (i.e., conductivity) and a mechanical adhesive strength (fixing strength) between the electrically conductive member and the electrically conductive pattern.

Further, since the mechanical adhesive strength is increased by the asperities, it is possible to reduce a content of a binder resin contained in the electrically conductive pattern. In other words, it is possible to increase a content of the metal powder contained in the electrically conductive pattern, and to reduce a resistance of the electrically conductive pattern itself. This allows the electrically conductive pattern more likely to pass an electric signal.

According to the structure, the asperities can be shallower than a thickness of the electrically conductive pattern.

According to the configuration, since the asperities are shallower than the thickness of the electrically conductive pattern, the electrically conductive pattern is not divided even in a location in which the asperities are provided. This makes it possible to successfully secure a conductivity in the electrically conductive pattern.

According to the structure, it is possible that the asperities encompass asperities which are deeper than the thickness of the electrically conductive pattern; and the asperities deeper than the thickness of the electrically conductive pattern are arranged so as not to break up the electrically conductive pattern.

According to the configuration, since the asperities deeper than the thickness of the electrically conductive pattern are included, the electrically conductive pattern is not connected in the location in which the asperities are provided. However, according to the configuration, the asperities deeper than the thickness of the electrically conductive pattern are arranged so as not to break up the electrically conductive pattern. It is therefore possible to secure conductivity in the electrically conductive pattern even in the configuration.

According to the structure, the surface of the electrically conductive member which surface is in contact with the electrically conductive pattern can have a surface shape made up of at least one selected from the group including (i) a shape in which the asperities are concentrically arranged, (ii) a shape in which the asperities are arranged to form a texture, (iii) a shape in which the asperities are arranged in a striped pattern, (iv) a shape in which the asperities are arranged in a lattice pattern, and (v) a shape in which the asperities are arranged in a spiral pattern.

According to the configuration, a contacting area between the electrically conductive member and the electrically conductive pattern is increased. This makes it possible to successfully improve an electrical adhesive strength (conductivity) and a mechanical adhesive strength (fixing strength) between the electrically conductive member and the electrically conductive pattern.

In particular, the shape in which the asperities are concentrically arranged and the shape in which the asperities are arranged in the spiral pattern can be easily formed on the electrically conductive member. In a case where two or more of the shapes are combined, it is possible to increase a contacting area between the electrically conductive member and the electrically conductive pattern, and this makes it possible to further improve an electrical adhesive strength (conductivity) and a mechanical adhesive strength (fixing strength) between the electrically conductive member and the electrically conductive pattern.

According to the structure, a region which is free of asperities can be provided in a periphery of the surface of the electrically conductive member which surface is in contact with the electrically conductive pattern, the region having a width which is larger than an average depth of the asperities.

According to the configuration, it is possible to prevent a steep change in surface shape between a region on top of the housing and a region on top of the electrically conductive member. This makes it possible to achieve a good connection between the regions.

According to the structure, asperities can be provided on a surface of the housing which surface is in contact with the electrically conductive pattern.

According to the configuration, a contacting area between the housing and the electrically conductive pattern is increased, and it is therefore possible to improve a mechanical adhesive strength (fixing strength).

According to the structure manufacturing method of the present invention, it is possible that the electrically conductive paste is made up of a first electrically conductive material and a second electrically conductive material; the electrically conductive pattern is made up of a first electrically conductive film and a second electrically conductive film; and the first electrically conductive film is formed by applying the first electrically conductive material to the electrically conductive member, and the second electrically conductive film is formed by applying the second electrically conductive material to the housing and to the first electrically conductive film.

According to the configuration, the electrically conductive film formed on the electrically conductive member can be made different from the electrically conductive film formed on the housing in conditions such as (i) a composition of the electrically conductive film and (ii) a forming condition. This makes it possible to employ conditions such as a composition and a forming condition which are suitable for each of the electrically conductive films. It is therefore possible to successfully secure both (i) the fixation between the electrically conductive pattern and the housing and (ii) the fixation between the electrically conductive pattern and the electrically conductive member.

According to the structure manufacturing method, it is possible that, in the step (a), the part of the structure is formed with use of the electrically conductive member on which the first electrically conductive film has been formed by applying the first electrically conductive material to the electrically conductive member; and, in the step (b), the second electrically conductive film is formed by applying the second electrically conductive material to the housing and to the first electrically conductive film.

According to the configuration, the first electrically conductive film can be formed on the electrically conductive member before the electrically conductive member is incorporated in the housing. This makes it possible to select a condition of forming the electrically conductive film without considering an influence on the housing. This allows an improvement in bonding force of the electrically conductive pattern to the electrically conductive member. Moreover, after the first electrically conductive film is formed on the electrically conductive member in advance, the electrically conductive member is provided in the housing, which is made of a dielectric substance, so as to penetrate the housing. In this case, it is therefore possible to identify an orientation of the electrically conductive member.

According to the structure manufacturing method, it is preferable that the first electrically conductive film and the second electrically conductive film have identical compositions.

According to the configuration, an affinity between the first electrically conductive film and the second electrically conductive film is improved, and it is therefore possible to improve an electrical adhesive strength (conductivity) and a mechanical adhesive strength (fixing strength) between the electrically conductive films.

According to the structure manufacturing method, it is preferable that a condition of forming the first electrically conductive film in the step (a) is different from a condition of forming the second electrically conductive film in the step (b).

According to the configuration, it is possible to separately set (i) the condition of forming the first electrically conductive film on the electrically conductive member and (ii) the condition of forming the second electrically conductive film on the housing. It is therefore possible to successfully improve bonding force of the electrically conductive pattern to at least any of the housing and the electrically conductive member.

According to the structure manufacturing method, each of the conditions can include at least any one of a temperature condition and a time condition.

According to the configuration, it is possible to set at least any of the temperature condition and the time condition in accordance with each of (i) a phase in which the first electrically conductive film is formed on the electrically conductive member and (ii) a phase in which the second electrically conductive film is formed on the housing. The temperature and the time are important factors for forming an electrically conductive film. According to the configuration, therefore, it is possible to successfully improve bonding force of the electrically conductive pattern to at least any of the housing and the electrically conductive member.

According to the structure manufacturing method, it is possible that an affinity between the first electrically conductive material and the electrically conductive member is higher than an affinity between the second electrically conductive material and the electrically conductive member; and, in the step (b), the first electrically conductive film is formed by applying the first electrically conductive material to the electrically conductive member, and then the second electrically conductive film is formed by applying the second electrically conductive material to the housing and to the first electrically conductive film.

According to the configuration, an affinity is high between the electrically conductive member and the first electrically conductive paste which is applied to the electrically conductive member, and an affinity is high between the housing and the second electrically conductive paste which is applied to the housing. This makes it possible to suitably and successfully fix the electrically conductive pattern to both the housing and the electrically conductive member.

According to the structure manufacturing method, it is possible that a condition of forming the first electrically conductive film in the step (a) is different from a condition of forming the second electrically conductive film in the step (b). According to the configuration, it is possible to separately set (i) the condition of forming the first electrically conductive film on the electrically conductive member and (ii) the condition of forming the second electrically conductive film on the housing. It is therefore possible to successfully improve bonding force of the electrically conductive pattern to at least any of the housing and the electrically conductive member.

According to the structure manufacturing method, each of the conditions includes at least any one of a temperature condition and a time condition.

According to the configuration, it is possible to set at least any of the temperature condition and the time condition in accordance with each of (i) a phase in which the first electrically conductive film is formed on the electrically conductive member and (ii) a phase in which the second electrically conductive film is formed on the housing. The temperature and the time are important factors for forming an electrically conductive film. According to the configuration, therefore, it is possible to successfully improve bonding force of the electrically conductive pattern to at least any of the housing and the electrically conductive member.

According to the structure of the present invention, it is possible that the electrically conductive paste is made up of a first electrically conductive material and a second electrically conductive material; an affinity between the first electrically conductive material and the electrically conductive member is higher than an affinity between the second electrically conductive material and the electrically conductive member; a first electrically conductive film is provided by applying the first electrically conductive material to the electrically conductive member, and a second electrically conductive film is provided by applying the second electrically conductive material to the housing and to the first electrically conductive film; and the electrically conductive pattern is made up of the first electrically conductive film and the second electrically conductive film.

According to the configuration, an affinity is high between the electrically conductive member and the first electrically conductive paste which is applied to the electrically conductive member, and an affinity is high between the housing and the second electrically conductive paste which is applied to the housing. This makes it possible to suitably and successfully fix the electrically conductive pattern to both the housing and the electrically conductive member.

According to the structure of the present invention, the electrically conductive member can have a columnar shape.

According to the configuration, it is possible to suitably configure the electrically conductive member which penetrates the housing.

According to the structure of the present invention, it is preferable that the housing and the electrically conductive member are integrally molded.

According to the configuration, it is possible to suitably embed the electrically conductive member in the housing.

According to the structure of the present invention, it is preferable that the housing serves as a housing of a communication apparatus, and the electrically conductive pattern serves as an antenna.

According to the configuration, by using the electrically conductive pattern as an antenna, it is possible to provide a communication apparatus in which a degree of freedom in design of the antenna is improved.

According to the structure of the present invention, it is preferable that a surface of the electrically conductive member, which surface is opposite to a surface on which the electrically conductive pattern is provided, is electrically connected with a circuit.

According to the configuration, it is possible to electrically connect the electrically conductive pattern with a circuit, which is provided oppositely to the electrically conductive pattern across the housing, via the electrically conductive member.

According to the structure of the present invention, it is preferable that a protective layer is provided on the electrically conductive pattern.

According to the configuration, it is possible to improve durability of the electrically conductive pattern. Moreover, it is possible to hide the electrically conductive pattern.

According to the structure manufacturing method of the present invention, it is preferable that, in the step (a), the housing and the electrically conductive member are integrally molded.

According to the configuration, it is possible to suitably embed the electrically conductive member in the housing.

According to the structure manufacturing method of the present invention, it is preferable that the housing serves as a housing of a communication apparatus, and the electrically conductive pattern serves as an antenna.

According to the configuration, it is possible to supply electric power to the electrically conductive pattern via an electric supply line provided oppositely to the electrically conductive pattern across the housing. This makes it possible to provide a communication apparatus in which a degree of freedom in design of an antenna is improved.

INDUSTRIAL APPLICABILITY

The present invention can be used in a field of manufacturing an electronic apparatus.

REFERENCE SIGNS LIST

1: Housing
1a: Surface
1b: Projection
1c: Covering part
1e: Projection
2: Electrically conductive member
2a: Surface
2b: Surface
2f: Round part
2i: Projection
2j: Projection
2k: Flat region
3: Electrically conductive pattern
3c: Electrically conductive pattern (first electrically conductive film)
3d: Electrically conductive pattern (second electrically conductive film)

3': Electrically conductive paste
3c': First electrically conductive paste (first electrically conductive material)
3d': Second electrically conductive paste (second electrically conductive material)
10: Structure
20: Spring terminal
21: Electric supply line
30: Communication circuit
50: Printing plate
100: Communication apparatus

The invention claimed is:

1. A structure comprising:
a housing which is made of a dielectric substance;
an electrically conductive member which is embedded in the housing so as to penetrate the housing;
an electrically conductive pattern which is provided on one end face of the electrically conductive member and on one surface of the housing which one surface is adjacent to the one end face of the electrically conductive member, the electrically conductive pattern being electrically connected with the electrically conductive member; and
a spring terminal through which electric power passes to be directly supplied via the other end face of the electrically conductive member,
the electrically conductive pattern being made up of an electrically conductive film which has no substantial shape retention property,
the electrically conductive member being a solid block of metal having a columnar shape and a flange is provided on the other end face of the electrically conductive member to enhance waterproof property of the housing.

2. The structure as set forth in claim 1, wherein:
the electrically conductive pattern is formed by applying an electrically conductive paste to the one of surfaces.

3. The structure as set forth in claim 2, wherein:
the electrically conductive paste is an electrically conductive material having a viscosity and contains at least metal powder and a solvent; and
the electrically conductive film formed by applying the electrically conductive paste is hardened by at least partially removing the solvent by drying the electrically conductive paste.

4. The structure as set forth in claim 2, wherein:
the electrically conductive pattern is formed by applying the electrically conductive paste to the one of surfaces by printing with use of a flexible printing plate.

5. The structure as set forth in claim 1, wherein:
the electrically conductive pattern is made up of a flexible electrically conductive film.

6. The structure as set forth in claim 1, wherein:
the electrically conductive member protrudes from the housing toward the electrically conductive pattern.

7. The structure as set forth in claim 2, wherein:
the electrically conductive member is depressed with respect to the housing on a side on which the electrically conductive pattern is provided.

8. The structure as set forth in claim 7, wherein:
the housing has a covering part that covers a periphery of a surface of the electrically conductive member which surface faces the electrically conductive pattern.

9. The structure as set forth in claim 2, wherein:
asperities are provided on a surface of the electrically conductive member which surface is in contact with the electrically conductive pattern.

10. The structure as set forth in claim 9, wherein:
the asperities encompass asperities which are deeper than the thickness of the electrically conductive pattern; and
the asperities deeper than the thickness of the electrically conductive pattern are arranged so as not to break up the electrically conductive pattern.

11. The structure as set forth in claim 9, wherein:
the surface of the electrically conductive member which surface is in contact with the electrically conductive pattern has a surface shape made up of at least one selected from the group including (i) a shape in which the asperities are concentrically arranged, (ii) a shape in which the asperities are arranged to form a texture, (iii) a shape in which the asperities are arranged in a striped pattern, (iv) a shape in which the asperities are arranged in a lattice pattern, and (v) a shape in which the asperities are arranged in a spiral pattern.

12. The structure as set forth in claim 9, wherein:
a region which is free of asperities is provided in a periphery of the surface of the electrically conductive member which surface is in contact with the electrically conductive pattern, the region having a width which is larger than an average depth of the asperities.

* * * * *